United States Patent
Lee et al.

(10) Patent No.: US 12,543,312 B2
(45) Date of Patent: Feb. 3, 2026

(54) SEMICONDUCTOR MEMORY DEVICE INCLUDING A CHARGE STORAGE LAYER

(71) Applicant: Samsung Electronics Co., Ltd., Suwon-si (KR)

(72) Inventors: Dong Kyu Lee, Suwon-si (KR); Yu Jin Kim, Suwon-si (KR); Guk Hyon Yon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 654 days.

(21) Appl. No.: 17/879,874

(22) Filed: Aug. 3, 2022

(65) Prior Publication Data

US 2023/0232627 A1    Jul. 20, 2023

(30) Foreign Application Priority Data

Jan. 17, 2022    (KR) .......................... 10-2022-0006319

(51) Int. Cl.
  *H10D 64/01*    (2025.01)
  *H10B 43/27*    (2023.01)
  *H10B 43/35*    (2023.01)
  *H10B 43/40*    (2023.01)

(52) U.S. Cl.
  CPC ............. *H10B 43/27* (2023.02); *H10B 43/35* (2023.02); *H10B 43/40* (2023.02); *H10D 64/037* (2025.01)

(58) Field of Classification Search
  None
  See application file for complete search history.

(56) References Cited

U.S. PATENT DOCUMENTS

| 6,809,371 B2 | 10/2004 | Sugiyama |
| 7,602,011 B2 | 10/2009 | Sugizaki |
| 9,368,510 B1 | 6/2016 | Rabkin et al. |

(Continued)

FOREIGN PATENT DOCUMENTS

| JP | 5306604 B2 | 10/2013 |
| KR | 100558003 B1 | 3/2006 |

(Continued)

OTHER PUBLICATIONS

Translation of WO-2020031939-A1 (Year: 2020).*

*Primary Examiner* — Kretelia Graham
*Assistant Examiner* — William Henry Anderson
(74) *Attorney, Agent, or Firm* — Harness, Dickey & Pierce, P.L.C.

(57) ABSTRACT

A semiconductor memory device includes a first substrate defining a cell array region, a mold structure including a plurality of gate electrodes sequentially spaced and stacked on the first substrate in a step form, and a channel hole defined as penetrating the plurality of gate electrodes on the cell array region in a vertical direction perpendicular to an upper surface of the first substrate. The device includes an information storage layer along side walls and a bottom surface of the channel hole, the information storage layer including a blocking insulation layer along the side walls and the bottom surface of the channel hole, a charge storage layer on the blocking insulation layer, and a tunneling insulation layer. The device includes a channel layer on the information storage layer inside the channel hole, and an insulation pattern arranged to fill the channel hole on the channel layer.

9 Claims, 36 Drawing Sheets

(56) References Cited

U.S. PATENT DOCUMENTS

| | | | |
|---|---|---|---|
| 10,043,819 B1* | 8/2018 | Lai | H10B 43/20 |
| 10,636,807 B2 | 4/2020 | Itokawa et al. | |
| 2006/0125027 A1 | 6/2006 | Chien et al. | |
| 2007/0228454 A1* | 10/2007 | Sugizaki | H10D 30/697 |
| | | | 257/E21.21 |
| 2009/0085094 A1* | 4/2009 | Lee | H10D 64/037 |
| | | | 257/E21.179 |
| 2009/0096008 A1* | 4/2009 | Kim | H10D 30/697 |
| | | | 257/649 |
| 2019/0198631 A1* | 6/2019 | Bhattacharyya | H10B 41/30 |
| 2020/0350330 A1* | 11/2020 | Ahn | H10B 41/35 |
| 2021/0066587 A1* | 3/2021 | Trinh | H10N 70/826 |
| 2022/0238672 A1* | 7/2022 | Lee | H10D 64/037 |
| 2022/0406796 A1* | 12/2022 | Seki | H10D 64/033 |

FOREIGN PATENT DOCUMENTS

| | | | |
|---|---|---|---|
| KR | 100885910 B1 | | 2/2009 |
| KR | 20150028189 A | | 3/2015 |
| WO | WO-2020031939 A1 * | | 2/2020 |

* cited by examiner

SEMICONDUCTOR MEMORY DEVICE INCLUDING A CHARGE STORAGE LAYER

CROSS-REFERENCE TO RELATED APPLICATION

This application claims priority from Korean Patent Application No. 10-2022-0006319 filed on Jan. 17, 2022 in the Korean Intellectual Property Office, and all the benefits accruing therefrom under 35 U.S.C. 119, the contents of which in its entirety are herein incorporated by reference.

FIELD

The present inventive concepts relate to a semiconductor memory device.

BACKGROUND

There is a desire or need to increase the degree of integration of semiconductor devices so as to satisfy excellent performance and low price desired or required by consumers. In the case of the semiconductor devices, because the degree of integration thereof is an important factor in determining the price of products, an increased degree of integration is particularly desired required. In the case of a two-dimensional or planar (or substantially planar) semiconductor device, the degree of integration thereof is mainly determined by an area occupied by a unit memory cell, and is therefore, greatly affected by the level of fine pattern forming technology.

However, since ultra-expensive apparatuses are used or required to reduce or miniaturize the pattern, the degree of integration of the two-dimensional semiconductor device is increasing, but it is still limited. Accordingly, three-dimensional semiconductor memory devices including memory cells arranged three-dimensionally have been proposed.

SUMMARY

Some example embodiments of the present inventive concepts provide a semiconductor memory device in which the loss of electric charges is reduced or prevented and the reliability is improved, by forming a charge storage layer disposed inside a channel hole to include a plurality of crystals including a hafnium oxide crystal and a silicon oxide layer surrounding the plurality of crystals.

According to an example embodiment of the present inventive concepts, a semiconductor memory device includes a first substrate defining a cell array region, and an extended region surrounding the cell array region, a mold structure including a plurality of gate electrodes sequentially spaced and stacked on the first substrate, the plurality of gate electrodes stacked on the extended region in a step form, and a channel hole defined as penetrating the plurality of gate electrodes on the cell array region in a vertical direction perpendicular to an upper surface of the first substrate. The device includes an information storage layer along side walls and a bottom surface of the channel hole and in contact with the plurality of gate electrodes, the information storage layer including a blocking insulation layer along the side walls and the bottom surface of the channel hole, a charge storage layer on the blocking insulation layer, and a tunneling insulation layer, the charge storage layer including a plurality of crystals including spherical crystals, the charge storage layer including a first layer surrounding the plurality of crystals, the first layer including silicon oxide, and the tunneling insulation layer on the first layer. The device includes a channel layer on the information storage layer inside the channel hole, and an insulation pattern arranged to fill the channel hole on the channel layer.

According to an example embodiment of the present inventive concepts, a semiconductor memory device includes a substrate, a plurality of gate electrodes sequentially spaced and stacked on the substrate, a block separation pattern extending in a first horizontal direction on the substrate, and separating the plurality of gate electrodes in a second horizontal direction different from the first horizontal direction, and a channel hole defined as penetrating the plurality of gate electrodes on the substrate in a vertical direction perpendicular to each of the first and second horizontal directions. the device includes a blocking insulation layer along side walls and a bottom surface of the channel hole and in contact with the plurality of gate electrodes, and a charge storage layer on the blocking insulation layer inside the channel hole, the charge storage layer including a plurality of crystals including hafnium oxide crystals defining a spherical shape, the charge storage layer including a first layer surrounding the plurality of crystals, the first layer including silicon oxide, and the charge storage layer including a first barrier layer on the first layer. The device includes a tunneling insulation layer on the charge storage layer inside the channel hole.

According to an example embodiment of the present inventive concepts, a semiconductor memory device includes a first substrate including a cell array region, and an extended region surrounding the cell array region, a mold structure including a plurality of gate electrodes sequentially spaced and stacked on the first substrate, the plurality of gate electrodes stacked on the extended region in a step form, a block separation pattern extending in a first horizontal direction on the first substrate and separating the plurality of gate electrodes in a second horizontal direction different from the first horizontal direction, and a channel hole defined to penetrate the plurality of gate electrodes on the cell array region in a vertical direction perpendicular to each of the first and second horizontal directions. The device includes an information storage layer along side walls and a bottom surface of the channel hole and in contact with the plurality of gate electrodes, the information storage layer including a blocking insulation layer along the side walls and the bottom surface of the channel hole, a charge storage layer on the blocking insulation layer, and a tunneling insulation layer, the charge storage layer including a plurality of crystals including hafnium oxide crystals defining a spherical shape, the charge storage layer including a first layer surrounding the plurality of crystals, the first layer including silicon oxide, the charge storage layer including a barrier layer on the first layer, the tunneling insulation layer on the first layer, and a diameter of each of the plurality of crystals in a range from 2 nm to 4 nm. The device includes a channel layer on the information storage layer inside the channel hole, an insulation pattern arranged to fill the channel hole on the channel layer, a bit line extending in the second horizontal direction on the plurality of gate electrodes, a second substrate below the first substrate, a peripheral circuit element on an upper surface of the second substrate, an interlayer insulating layer covering the peripheral circuit element between the upper surface of the second substrate and a lower surface of the first substrate, and a wiring pattern inside the interlayer insulating layer.

However, some example embodiments of the present inventive concepts are not restricted to the ones set forth herein. The above and other example embodiments of the present inventive concepts will become more apparent by referencing the detailed description of the present inventive concepts given below.

BRIEF DESCRIPTION OF THE DRAWINGS

The above and other example embodiments of the present inventive concepts will become more apparent by describing in detail example embodiments thereof referring to the attached drawings, in which.

DETAILED DESCRIPTION OF SOME EXAMPLE EMBODIMENTS

Hereinafter, semiconductor memory devices according to some example embodiments of the present inventive concepts will be described referring to FIGS. 1 to 5.

Figure 1:
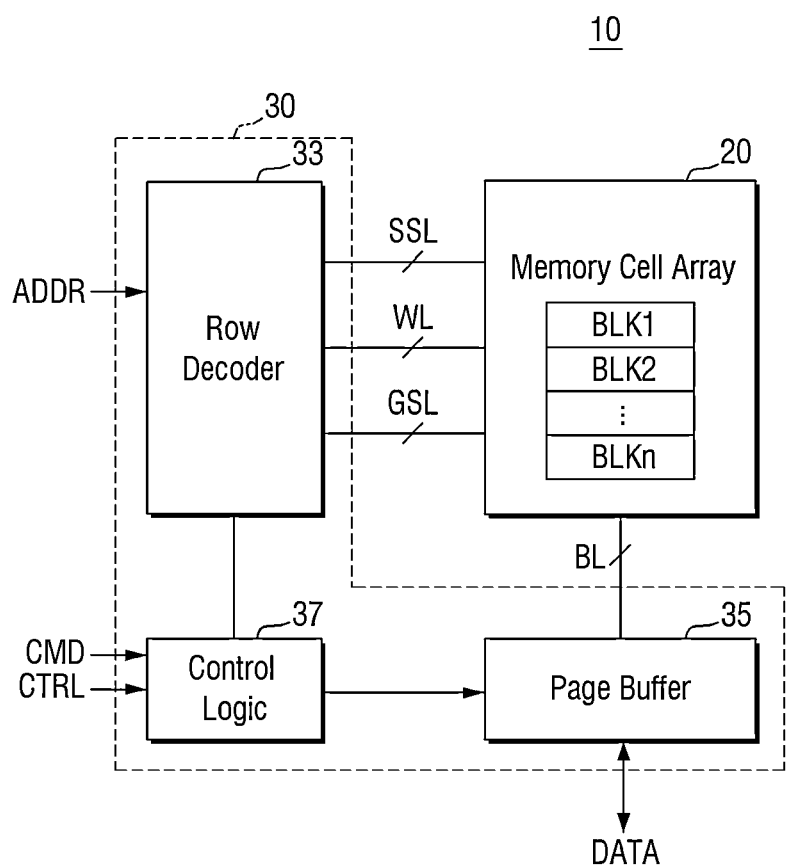
FIG. 1 is an example block diagram for explaining a semiconductor memory device according to some example embodiments.
Figure 2:
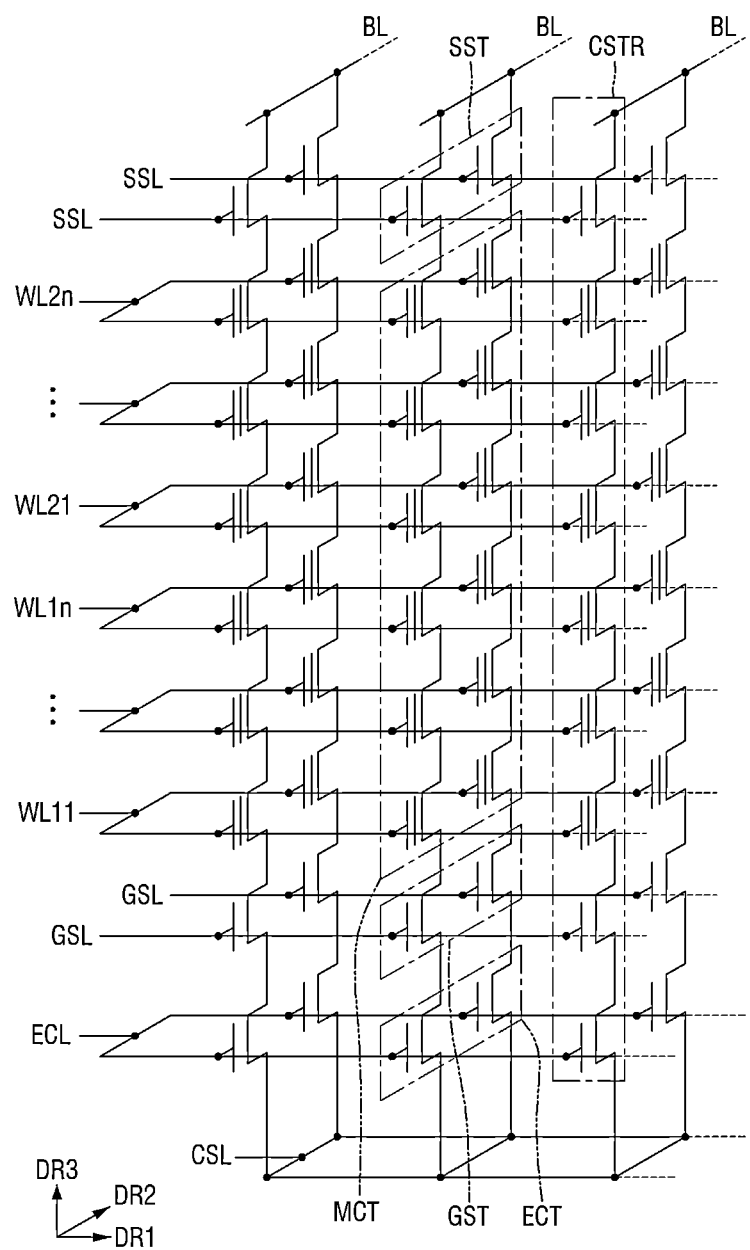
FIG. 2 is an example circuit diagram for explaining the semiconductor memory device according to some example embodiments.
Figure 3:
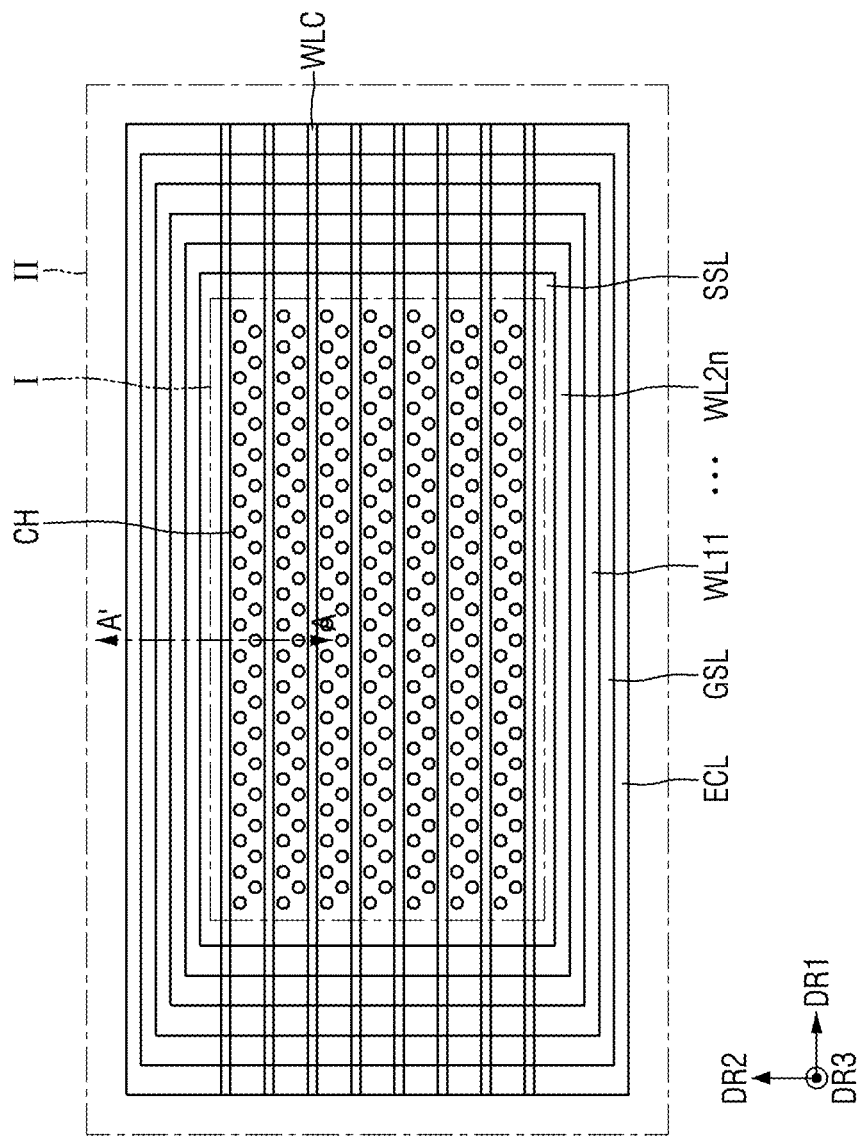
FIG. 3 is a layout diagram for explaining a semiconductor memory device according to some example embodiments of the present inventive concepts.
Figure 4:
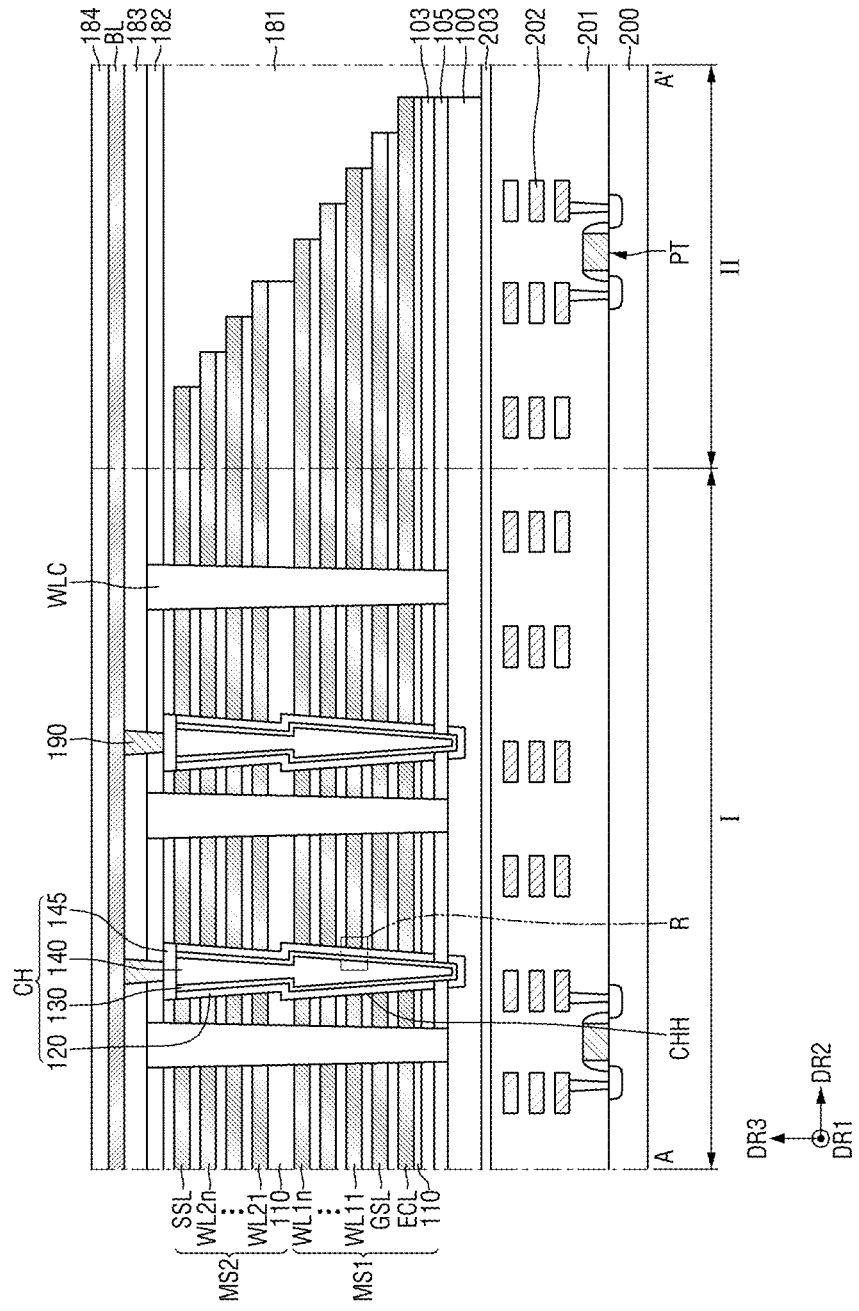
FIG. 4 is a cross-sectional view taken along a line A-A' of FIG. 3.
Figure 5:
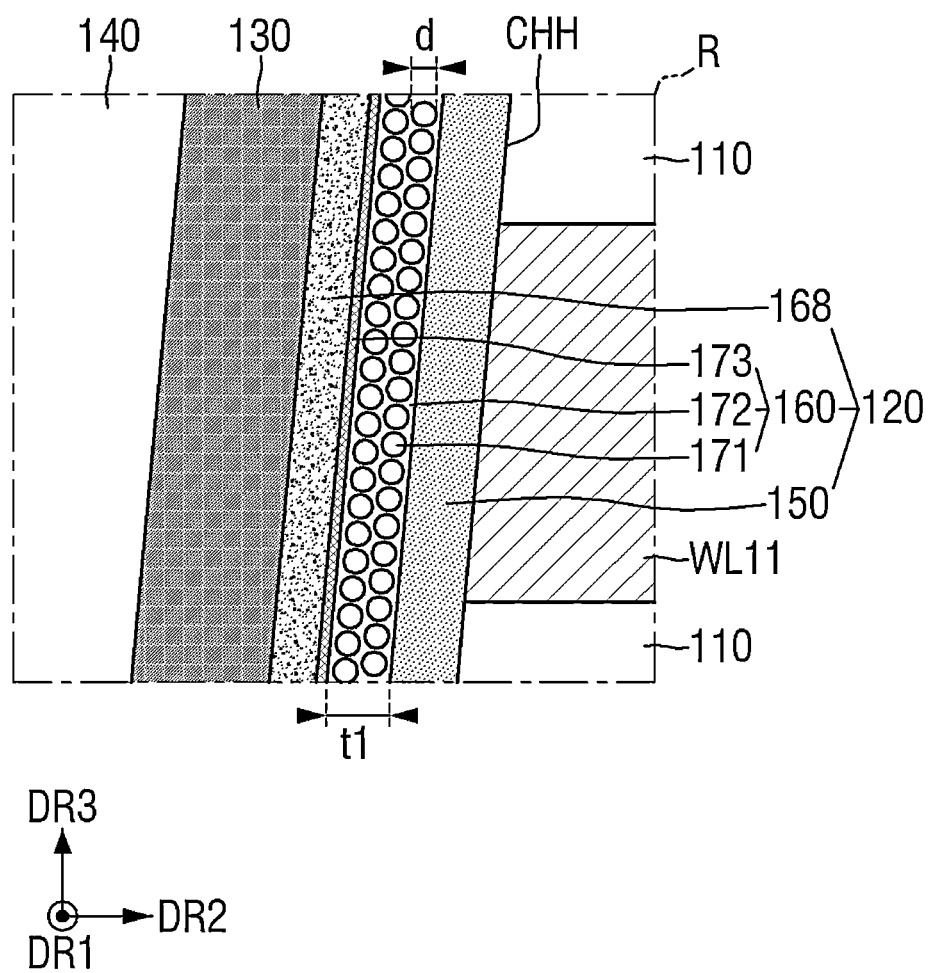
FIG. 5 is an enlarged view of a region R of FIG. 4.

FIG. 1 is an example block diagram for explaining a semiconductor memory device according to some example embodiments of the inventive concepts. FIG. 2 is an example circuit diagram for explaining the semiconductor memory device according to some example embodiments of the inventive concepts. FIG. 3 is a layout diagram for explaining a semiconductor memory device according to some example embodiments of the present inventive concepts. FIG. 4 is a cross-sectional view taken along a line A-A' of FIG. 3. FIG. 5 is an enlarged view of a region R of FIG. 4.

Referring to FIG. 1, a semiconductor memory device 10 according to some example embodiments of the present inventive concepts includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, a row decoder 33, and a page buffer 35. Although not shown, the peripheral circuit 30 may further include various sub-circuits such as an input/output circuit, a voltage generation circuit that generates various voltages necessary for the operation of the semiconductor memory device 10, and an error correction circuit for correcting error of the data DATA that is read from the memory cell array 20.

The control logic 37 may be connected to the row decoder 33, the input/output circuit, and the voltage generation circuit. The control logic 37 may control the overall operations of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transfer a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. Specifically, when the program operation is performed, the page buffer 35 may operate as the writer driver, and apply a voltage according to the data DATA to be stored in the memory cell array 20 to the bit line BL. When performing the read operation, the page buffer 35 may operate as a sense amplifier and sense the data DATA stored in the memory cell array 20.

Referring to FIG. 2, the memory cell array (e.g., 20 of FIG. 1) of the semiconductor device according to some example embodiments may include a common source line CSL, a plurality of bit lines BL, and a plurality of cell strings CSTR.

The common source line CSL may extend in a first horizontal direction DR1. In some example embodiments, a plurality of common source lines CSL may be arranged two-dimensionally. For example, the plurality of common source lines CSL may be spaced apart from each other and each extend in the first horizontal direction DR1. The same or substantially the same voltage may be electrically applied to the common source lines CSL, or different voltages may be applied to the common source lines CSL and the common source lines CSL may be controlled separately.

The plurality of bit lines BL may be arranged two-dimensionally. For example, the bit lines BL are spaced apart from each other and may each extend in a second horizontal direction DR2 that intersects the first horizontal direction DR1. A plurality of cell strings CSTR may be connected in parallel to each bit line BL. The cell strings CSTR may be commonly connected to the common source line CSL. That is, the plurality of cell strings CSTR may be disposed between the bit lines BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST and the memory cell transistors MCT may be connected in series.

The common source line CSL may be commonly connected to sources of the ground selection transistors GST. Also, the ground selection line GSL, a plurality of word lines WL11 to WL1n and WL21 to WL2n, and the string selection line SSL may be disposed between the common source line CSL and the bit line BL. The ground selection line GSL may be used as a gate electrode of the ground selection transistor GST, the word lines WL11 to WL1n and WL21 to WL2n may be used as gate electrodes of the memory cell transistors MCT, and the string selection line SSL may be used as the gate electrode of the string selection transistor SST.

In some example embodiments, an erase control transistor ECT may be disposed between the common source line CSL and the ground selection transistor GST. The common source line CSL may be commonly connected to the sources of the erase control transistors ECT. Further, an erase control line ECL may be disposed between the common source line CSL and the ground selection line GSL. The erase control line ECL may be used as the gate electrode of the erase control transistor ECT. The erase control transistors ECT may generate a gate induced drain leakage (GIDL) to perform the erase operation of the memory cell array.

Referring to FIGS. 3 to 5, the semiconductor memory device according to some example embodiments includes a first substrate 100, a source structure 105, a support layer 103, a first mold structure MS1, a second mold structure MS2, a channel structure CH, a block separation pattern WLC, first to fourth interlayer insulating layers 181, 182, 183 and 184, a bit line BL, a bit line contact 190, a second substrate 200, a peripheral circuit element PT, a fifth interlayer insulating layer 201, a wiring pattern 202, and an insulating liner 203.

The first substrate 100 may include, for example, a semiconductor substrate such as a silicon substrate, a germanium substrate, a silicon-germanium substrate, etc. Alternatively, the first substrate 100 may include a silicon-on-insulator (SOI) substrate, a germanium-on-insulator (GOI) substrate, and the like. In some example embodiments, the first substrate 100 may include impurities. For example, the first substrate 100 may include n-type impurities (e.g., phosphorus (P), arsenic (As), etc.). The first substrate 100 may include a cell array region I and an extended region II.

A memory cell array (e.g., 20 of FIG. 1) including a plurality of memory cells may be formed in the cell array region I. For example, a channel structure CH, a bit line BL, a plurality of gate electrodes ECL, GSL, WL11 to WL1n, WL21 to WL2n, and SSL, etc., which will be described below, may be disposed in the cell array region I. The extended region II may be disposed around the cell array region I. A plurality of gate electrodes ECL, GSL, WL11 to WL1n, WL21 to WL2n, and SSL, which will be described below, may be stacked in the extended region II in a step form.

The source structure 105 may be disposed on the upper surface of the first substrate 100. The source structure 105 may be disposed between an upper surface of the first substrate 100 and mold structures MS1 and MS2. For example, the source structure 105 may extend along the upper surface of the first substrate 100. The source structure 105 may be provided as a common source line e.g., (CSL of FIG. 2) of the semiconductor memory device.

The support layer 103 may be disposed on the source structure 105. The support layer 103 may be disposed between the source structure 105 and the mold structures MS1 and MS2. The support layer 103 may be used as a support layer for inhibiting or preventing the mold stack from collapsing or falling in a replacement process for forming the source structure 105. Each of the source structure 105 and the support layer 103 may include, for example, an impurity-doped polycrystal silicon or metal. However, example embodiments are not limited thereto.

The mold structures MS1 and MS2 may be disposed on the support layer 103. The mold structures MS1 and MS2 may include a plurality of gate electrodes ECL, GSL, WL11 to WL1n, WL21 to WL2n, and SSL and a plurality of mold insulating layers 110 stacked on the first substrate 100.

Each of the gate electrodes ECL, GSL, WL11 to WL1n, WL21 to WL2n, and SSL and each mold insulating layer 110 may have a layered structure extending in parallel with the upper surface of the first substrate 100. The gate electrodes ECL, GSL, WL11 to WL1n, WL21 to WL2n, and SSL and the mold insulating layers 110 may be alternately stacked on the first substrate 100.

In some example embodiments, the mold structures MS1 and MS2 may include a first mold structure MS1 and a second mold structure MS2 that are sequentially stacked on the first substrate 100.

The first mold structure MS1 may include a plurality of first gate electrodes ECL, GSL, and WL11 to WL1n which are sequentially spaced apart and stacked on the first substrate 100. The first gate electrodes ECL, GSL, and WL11 to WL1n and the mold insulating layer 110 may be alternately stacked on the first substrate 100. In some example embodiments, the first gate electrodes ECL, GSL, and WL11 to WL1n may include an erase control line ECL, a ground selection line GSL, and a plurality of first word lines WL11 to WL1n that are sequentially stacked on the first substrate 100. In some other example embodiments, the erase control line ECL may be omitted.

The second mold structure MS2 may include second gate electrodes WL21 to WL2n and SSL which are sequentially spaced apart and stacked on the first mold structure MS1. The second gate electrodes WL21 to WL2n, SSL and the mold insulating layer 110 may be alternately stacked on the first mold structure MS1. In some example embodiments, the second gate electrodes WL21 to WL2n, SSL may include a plurality of second word lines WL21 to WL2n and a string selection line SSL that are sequentially stacked on the first mold structure MS1. For example, a thickness of the mold insulating layer 110 disposed at the lowermost part of the second mold structure MS2 may be greater than a thickness of the other mold insulating layer 110. However, example embodiments are not limited thereto.

The gate electrodes ECL, GSL, WL11 to WL1n, WL21 to WL2n, and SSL may each include a conductive material. For example, the gate electrodes ECL, GSL, WL11 to WL1n, WL21 to WL2n, and SSL may include metals such as tungsten (W), cobalt (Co), and nickel (Ni), or semiconductor materials such as silicon. However, example embodiments are not limited thereto.

The mold insulating layer 110 may include an insulating material. For example, the mold insulating layer 110 may include at least one of silicon oxide, silicon nitride, and silicon oxynitride, but example embodiments are not limited thereto.

The first interlayer insulating layer 181 may be disposed on the first substrate 100. The first interlayer insulating layer 181 may cover the mold structures MS1 and MS2. The second interlayer insulating layer 182 may be disposed on the first interlayer insulating layer 181. Each of the first interlayer insulating layer 181 and the second interlayer insulating layer 182 may include, for example, at least one of a silicon oxide, a silicon oxynitride, and a low dielectric constant (low-k) material having a smaller dielectric constant than the silicon oxide. However, example embodiments are not limited thereto.

The block separation pattern WLC may extend in the first horizontal direction DR1. The block separation pattern WLC may penetrate each of the first interlayer insulating layer 181, the mold structures MS1 and MS2, the support layer 103 and the source structure 105 in a vertical direction DR3 perpendicular to each of the first and second horizontal directions DR1 and DR2. For example, the block separation pattern WLC may extend to the first substrate 100.

The block separation pattern WLC may separate each of the first interlayer insulating layer 181, the mold structures MS1 and MS2, the support layer 103 and the source structure 105 in the second horizontal direction DR2. That is, the block separation pattern WLC may separate a plurality of gate electrodes ECL, GSL, WL11 to WL1n, WL21 to WL2n, and SSL in the second horizontal direction DR2.

The mold structures MS1 and MS2 separated by the block separation pattern WLC may form a plurality of memory cell blocks (BLK1 to BLKn of FIG. 1). A plurality of channel structures CH may be disposed in each of the memory cell blocks (BLK1 to BLKn of FIG. 1). The number of channel structures CH disposed in each of the memory cell blocks (BLK1 to BLKn of FIG. 1) is not limited to that shown in FIG. 3, and may vary. The block separation pattern WLC may include, for example, at least one of silicon oxide, silicon nitride and silicon oxynitride, but example embodiments are not limited thereto.

A channel hole CHH may penetrate each of the first interlayer insulating layer 181, the mold structures MS1 and MS2, the support layer 103 and the source structure 105 in the vertical direction DR3. The channel hole CHH may extend into the first substrate 100. The channel structure CH may be disposed inside the channel hole CHH. The channel structure CH may have a pillar shape (e.g., a cylindrical shape) extending in the vertical direction DR3. The channel structure CH may intersect each of the plurality of gate electrodes ECL, GSL, WL11 to WL1n, WL21 to WL2n, and SSL.

In some example embodiments, the plurality of channel structures CH may be arranged in the form of a zigzag. For example, as shown in FIG. 3, a plurality of channel structures CH may be arranged alternately in the first horizontal direction DR1 and the second horizontal direction SR2. The plurality of channel structures CH arranged in the form of a zigzag may further improve the degree of integration of the semiconductor memory device. In some example embodiments, the plurality of channel structures CH may be arranged in the form of a honeycomb Although FIG. 3 shows that a plurality of channel structures CH are disposed only in the cell array region I, this is merely for convenience of explanation. For example, in order to reduce the stress applied to the mold structures MS1 and MS2, a dummy channel structure having a shape similar to that of the channel structure CH may be disposed in the mold structures MS1 and MS2 of the extended region II. Such a dummy channel structure may extend in the vertical direction DR3 and penetrate the first interlayer insulating layer 181 and the mold structures MS1 and MS2.

The channel structure CH may include an information storage layer 120, a channel layer 130, an insulation pattern 140, and a bit line pad 145.

The information storage layer 120 may be disposed along the side walls and bottom surface of the channel hole CHH. The information storage layer 120 may be in contact with each of the plurality of gate electrodes ECL, GSL, WL11 to WL1n, WL21 to WL2n, and SSL. For example, the information storage layer 120 may be separated by the source structure 105. However, example embodiments are not limited thereto. The information storage layer 120 may include a blocking insulation layer 150, a charge storage layer 160, and a tunneling insulation layer 168.

The blocking insulation layer 150 may be disposed along the side wall and the bottom surface of the channel hole CHH. The blocking insulation layer 150 may be in contact with each of the plurality of gate electrodes ECL, GSL, WL11 to WL1n, WL21 to WL2n, and SSL. The blocking insulation layer 150 may include, for example, silicon oxide or a high dielectric constant material having a higher dielectric constant than silicon oxide (e.g., aluminum oxide ($Al_2O_3$), hafnium oxide ($HfO_2$)), but example embodiments are not limited thereto.

The charge storage layer 160 may be disposed on the blocking insulation layer 150 inside the channel hole CHH. The charge storage layer 160 may include a plurality of crystals 171, a first layer 172, and a first barrier layer 173. The first layer 172 may be disposed on the blocking insulation layer 150 inside the channel hole CHH. The first layer 172 may include, for example, silicon oxide. A thickness t1 of the first layer 172 may be in a range of, for example, 4 nm to 8 nm (or greater or lesser thicknesses).

A plurality of crystals 171 may be disposed inside the first layer 172. That is, the first layer 172 may surround the plurality of crystals 171. Each of the plurality of crystals 171 may include spherical crystals. For example, each of the plurality of crystals 171 may be spaced apart from each other. However, example embodiments are not limited thereto. In some other example embodiments, at least a part of each of the plurality of crystals 171 may be in contact with each other.

For example, a plurality of crystals 171 may be disposed in two rows along the side wall of the blocking insulation layer 150. For example, the plurality of crystals 171 include a first plurality of crystals disposed along the side wall of the blocking insulation layer 150, and a second plurality of crystals disposed along the side wall of the tunneling insulation layer 168. For example, each of the second plurality of crystals may be spaced apart from each of the first plurality of crystals.

For example, the first plurality of crystals are spaced apart from the blocking insulation layer 150, and the second plurality of crystals are spaced apart from the first barrier layer 173. However, example embodiments are not limited thereto. In some other example embodiments, at least a part of the first plurality of crystals may be in contact with the blocking insulation layer 150. Further, at least a part of the second plurality of crystals may be in contact with the first barrier layer 173.

A diameter d of each of the plurality of crystals 171 may be in a range of 2 nm to 4 nm (or greater or lesser thicknesses). Each of the plurality of crystals 171 may include, for example, a spherical hafnium oxide crystal.

The first barrier layer 173 may be disposed on the first layer 172 inside the channel hole CHH. The first barrier layer 173 may include a metal oxide. The first barrier layer 173 may include a material having a greater Band GAP than that of the first layer 172. The first barrier layer 173 may include, for example, aluminum oxide, magnesium oxide, etc.

The tunneling insulation layer 168 may be disposed on the first barrier layer 173 inside the channel hole CHH. The tunneling insulation layer 168 may include, for example, silicon oxide or a high dielectric constant material having a higher dielectric constant than silicon oxide (e.g., aluminum oxide ($Al_2O_3$), hafnium oxide ($HfO_2$)), but example embodiments are not limited thereto.

The channel layer 130 is disposed on the information storage layer 120 inside the channel hole CHH. That is, the channel layer 130 may be disposed on the tunneling insulation layer 168 inside the channel hole CHH. For example, the channel layer 130 may be in contact with the source structure 105 extending inside the channel hole CHH. The channel layer 130 may include, for example, semiconductor materials such as single crystal silicon, polycrystal silicon, organic semiconductors and carbon nanostructures, but example embodiments are not limited thereto.

The insulation pattern 140 may fill the channel hole CHH on the channel layer 130. The insulation pattern 140 may include, for example, at least one of silicon oxide, a silicon oxynitride and a low dielectric constant material, but example embodiments are not limited thereto.

The bit line pad 145 may be disposed on each of the information storage layer 120, the channel layer 130, and the insulation pattern 140. The bit line pad 145 may be in contact with the upper surfaces of each of the information storage layer 120, the channel layer 130, and the insulation pattern 140. For example, the upper surface of the bit line pad 145 may be formed on the same plane as the upper surface of the second mold structure MS2. However, example embodiments are not limited thereto. The bit line pad 145 may include a conductive material. For example, the bit line pad 145 may include a semiconductor material doped with impurities.

A third interlayer insulating layer 183 may be disposed on the second interlayer insulating layer 182. The third interlayer insulating layer 183 may include, for example, at least one of silicon oxide, silicon oxynitride, and a low dielectric constant (low-k) material having a lower dielectric constant than silicon oxide, but example embodiments are not limited thereto.

The bit line BL may be disposed on the third interlayer insulating layer 183. The bit line BL may extend in the second horizontal direction DR2. The bit line BL may be electrically connected to at least one of the plurality of channel structures CH. The bit line contact 190 penetrates the second interlayer insulating layer 182 and the third interlayer insulating layer 183 in the vertical direction DR3. The bit line contact 190 may electrically connect any one of the plurality of channel structures CH and the bit line BL. Each of the bit line BL and the bit line contact 190 may include a conductive material.

A fourth interlayer insulating layer 184 may be disposed on the bit line BL. The fourth interlayer insulating layer 184 may include, for example, at least one of silicon oxide, silicon oxynitride, and a low dielectric constant (low-k) material having a lower dielectric constant than silicon oxide, but example embodiments are not limited thereto.

For example, a peripheral circuit region may be disposed on a lower surface of the first substrate 100. The peripheral circuit region may include a second substrate 200, a peripheral circuit element PT, a fifth interlayer insulating layer 201, a wiring pattern 202, and an insulating liner 203.

The second substrate 200 may be disposed below the first substrate 100. The second substrate 200 may include, for example, a semiconductor substrate such as a silicon substrate, a germanium substrate, a silicon-germanium substrate, etc. Alternatively, the second substrate 200 may include a silicon-on-insulator (SOI) substrate, a germanium-on-insulator (GOI) substrate, or the like.

The peripheral circuit element PT may be disposed on an upper surface of the second substrate 200. The peripheral circuit element PT may be a peripheral circuit (e.g., 30 of FIG. 1) that controls the operation of the semiconductor memory device. For example, the peripheral circuit element PT may include a control logic (e.g., 37 of FIG. 1), a row decoder (e.g., 33 of FIG. 1), a page buffer (e.g., 35 of FIG. 1), and the like.

The peripheral circuit element PT may include, for example, a transistor, but example embodiments are not limited thereto. For example, the peripheral circuit element PT may include various active elements such as transistors, various passive elements such as capacitors, resistors, and inductors, etc.

A fifth interlayer insulating layer 201 may be disposed between a lower surface of the first substrate 100 and an upper surface of the second substrate 200. The fifth interlayer insulating layer 201 may cover the peripheral circuit element PT. The fifth interlayer insulating layer 201 may include, for example, at least one of silicon oxide, silicon oxynitride, and a low dielectric constant (low-k) material having a smaller dielectric constant than silicon oxide. However, example embodiments are not limited thereto.

The wiring pattern 202 may be disposed inside the fifth interlayer insulating layer 201. The wiring pattern 202 may be electrically connected to the peripheral circuit element PT. The wiring pattern 202 may include a conductive material. The insulating liner 203 may be disposed between the fifth interlayer insulating layer 201 and the lower surface of the first substrate 100. The insulating liner 203 may include insulating materials, for example, at least one of silicon oxide, silicon nitride, and silicon oxynitride.

In the semiconductor memory device according to some example embodiments of the present disclosure, by forming the charge storage layer 160 disposed inside the channel hole CHH to include a plurality of crystals 171 including a hafnium oxide crystal and a first layer 172 that surrounds the plurality of crystals 171 and include silicon oxide, it is possible to inhibit or prevent the loss of electric charges and improve the reliability of the semiconductor memory device.

Hereinafter, a method for fabricating a semiconductor memory device according to some example embodiments of the present inventive concepts will be described referring to FIGS. 4 and 6 to 15.

FIGS. 6 to 15 are intermediate step diagrams for explaining the method for fabricating a semiconductor memory device according to some example embodiments of the present inventive concepts.

Figure 6:
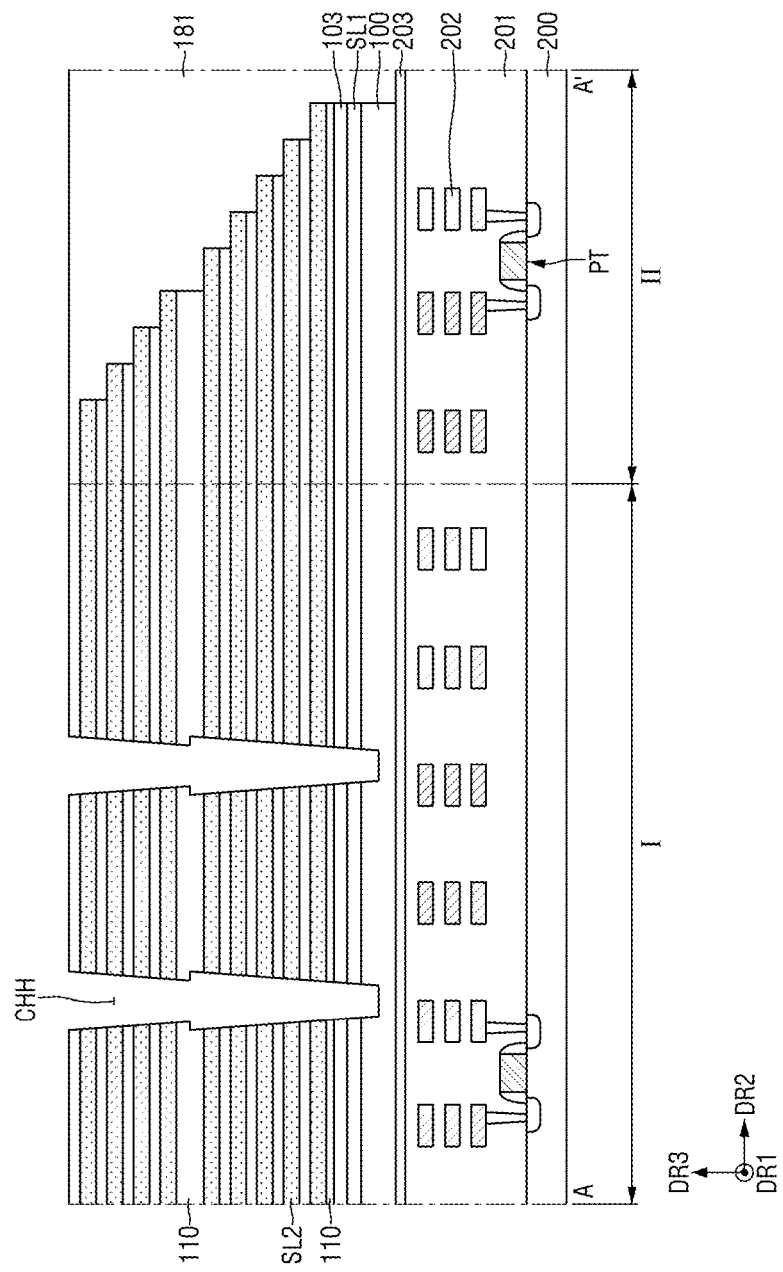
FIGS. 6, 7, 8, 9, 10, 11, 12, 13, 14 and 15 are intermediate step diagrams for explaining a method for fabricating a semiconductor memory device according to some example embodiments of the present inventive concepts.

Referring to FIG. 6, a peripheral circuit region including a second substrate 200, a peripheral circuit element PT, a fifth interlayer insulating layer 201, a wiring pattern 202, and an insulating liner 203 may be provided.

Subsequently, the first substrate 100, the first sacrificial layer SL1, and the support layer 103 may be sequentially formed on the insulating liner 203. The first sacrificial layer SL1 may include, for example, at least one of silicon oxide, silicon nitride and silicon oxynitride.

Subsequently, the mold insulating layer 110 and the second sacrificial layer SL2 may be alternately stacked to correspond to the first mold structure MS1 of FIG. 4. For example, the mold insulating layer 110 may be formed on the uppermost second sacrificial layer SL2. The second sacrificial layer SL2 may include, for example, silicon nitride. In this case, the mold insulating layer 110 and the second sacrificial layer SL2 may be formed to have a stepped shape on the extended region II.

Subsequently, a lower channel hole (a lower part of CHH) may be formed to penetrate the mold insulating layer 110, the second sacrificial layer SL2, the support layer 103, and the first sacrificial layer SL1 in the vertical direction DR3 and extend into the interior of the first substrate 100. Subsequently, after filling the interior of the lower channel hole (the lower part of CHH) with a sacrificial pattern (not shown), the mold insulating layer 110 and the second sacrificial layer SL2 may be alternately stacked on the mold insulating layer 110. In this case, the mold insulating layer 110 and the second sacrificial layer SL2 may be formed to have a stepped shape on the extended region II. Subsequently, the first interlayer insulating layer 181 may be formed to cover the mold insulating layer 110 and the second sacrificial layer SL2.

Next, the upper channel hole (an upper part of CHH) may be formed to overlap the lower channel hole (the lower part of CHH) in the vertical direction DR3. The upper channel hole (the upper part of CHH) may penetrate the mold insulating layer 110 and the second sacrificial layer SL2 in the vertical direction DR3 to expose the sacrificial pattern (not shown) inside the lower channel hole (the lower part of CHH). The sacrificial pattern (not shown) inside the lower channel hole (the lower part of CHH) may then be removed.

Referring to FIGS. 7 to 11, the information storage layer 120, the channel layer 130, the insulation pattern 140, and the bit line pad 145 may be sequentially formed inside the channel hole CHH.

Figure 8:
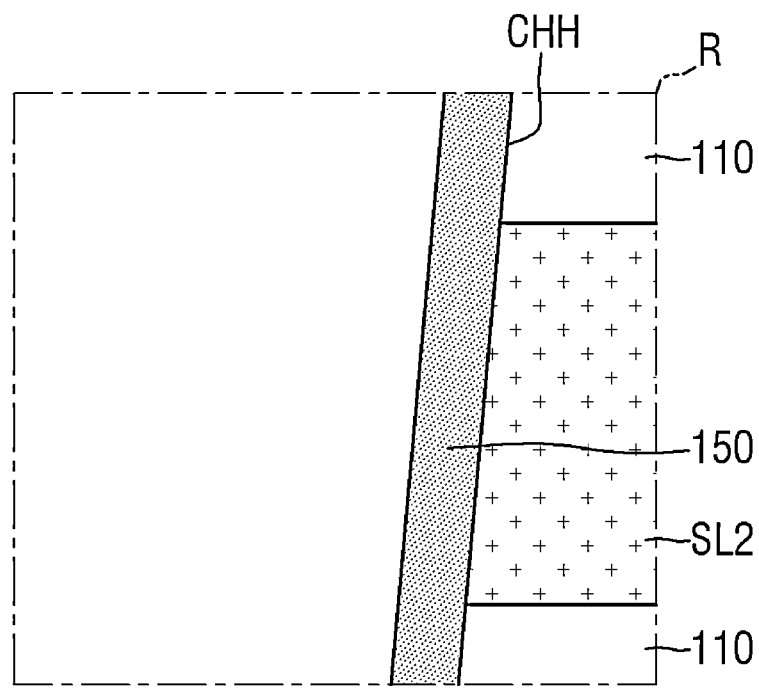
Figure 8:
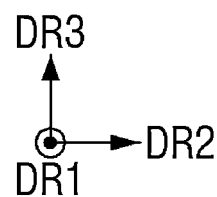

Specifically, referring to FIG. 8, the blocking insulation layer 150 may be formed along the side wall and the bottom surface of the channel hole CHH. For example, the blocking insulation layer 150 may be conformally formed.

Figure 9:
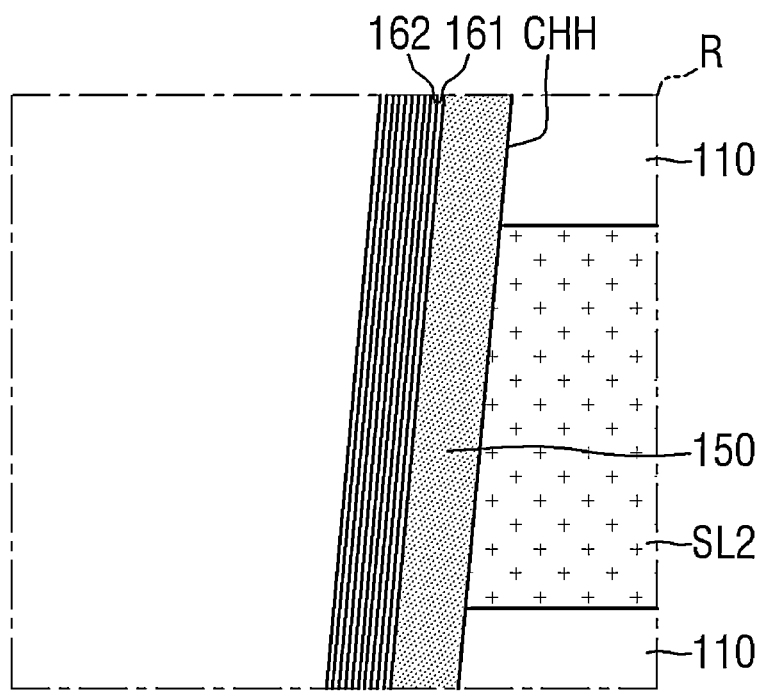
Figure 9:
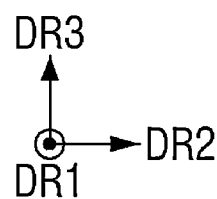

Referring to FIG. 9, a first sub-layer 161 and a second sub-layer 162 may be alternately formed on the blocking insulation layer 150 inside the channel hole CHH. For example, each of the first sub-layer 161 and the second sub-layer 162 may be formed, using an ALD (Atomic Layer Deposition) process. For example, any one of the first sub-layer 161 and the second sub-layer 162 may include hafnium oxide, and the other of the first sub-layer 161 and the second sub-layer 162 may include silicon oxide, but example embodiments are not limited thereto.

Figure 10:
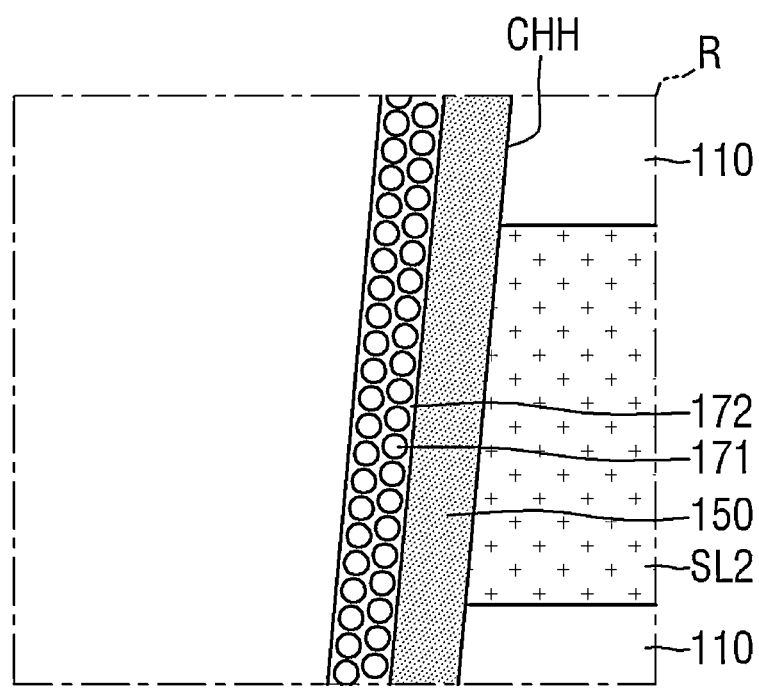
Figure 10:
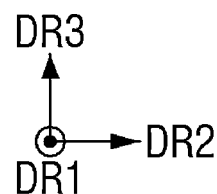

Referring to FIG. 10, a heat treatment process may be performed on the first sub-layer (161 of FIG. 9) and the second sub-layer (162 of FIG. 9) that are alternately stacked. For example, the heat treatment process may be performed at 800° C. or higher (or lower in other example embodiments). The first sub-layer (161 of FIG. 9) and the second sub-layer (162 of FIG. 9) may be phase-separated through the heat treatment process. Therefore, a plurality of crystals 171 including hafnium oxide crystals having a spherical shape, and a first layer 172 surrounding the plurality of crystals 171 and including silicon oxide may be formed.

Figure 7:
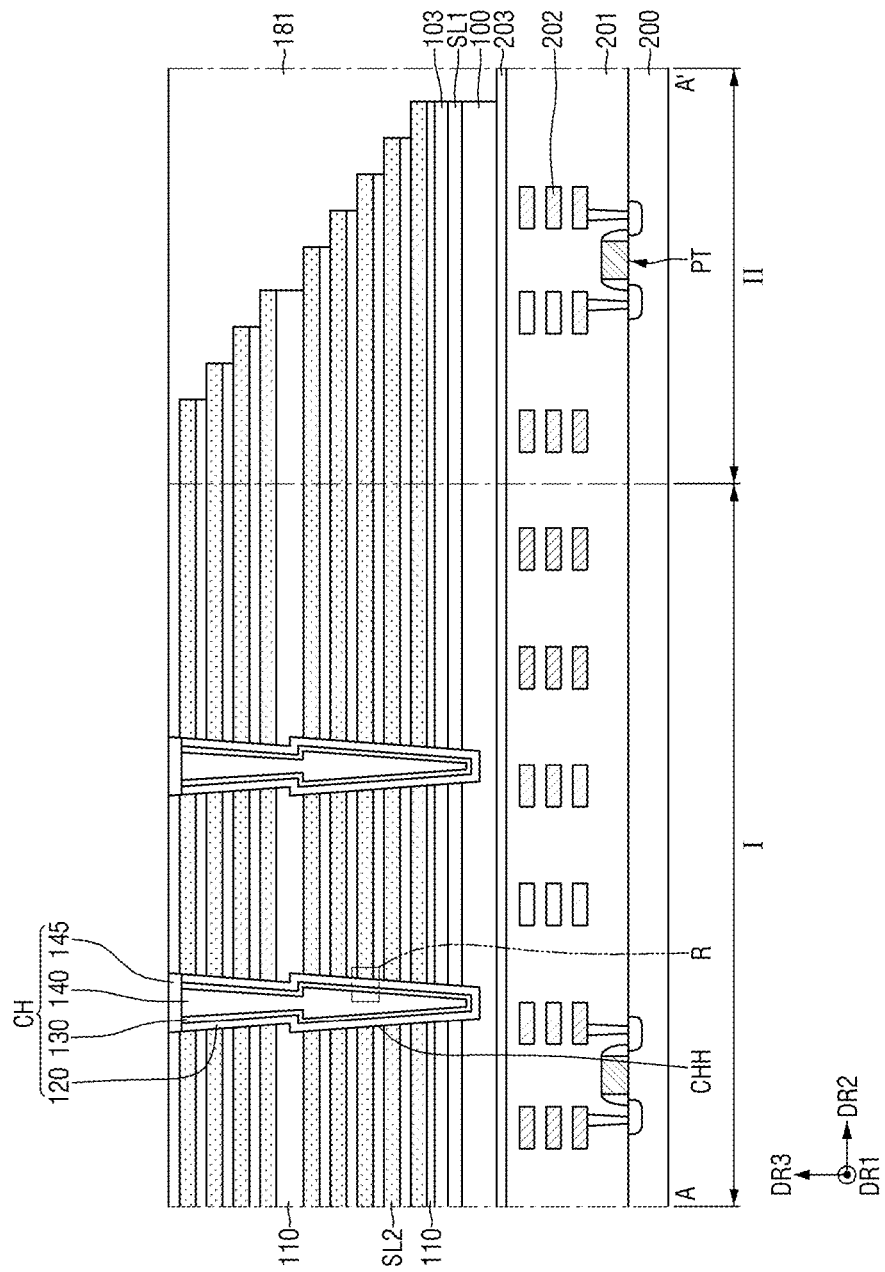
Figure 11:
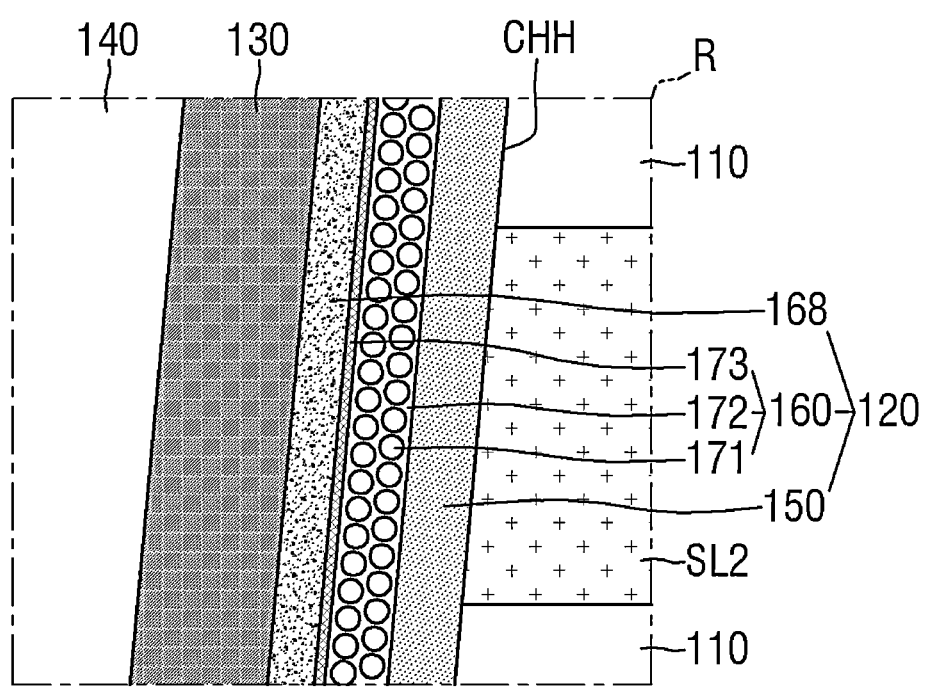
Figure 11:
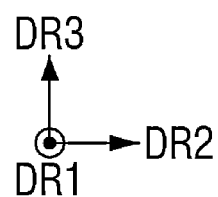

Referring to FIGS. 7 and 11, the first barrier layer 173 and the channel layer 130 may be sequentially formed on the first layer 172 inside the channel hole CHH. For example, each of the first barrier layer 173 and the channel layer 130 may be conformally formed. Subsequently, the insulation pattern 140 may be formed on the channel layer 130 to fill the channel hole CHH. Subsequently, a bit line pad 145 may be formed on each of the information storage layer 120, the channel layer 130, and the insulation pattern 140. The channel structure CH may be formed through such a process.

Figure 12:
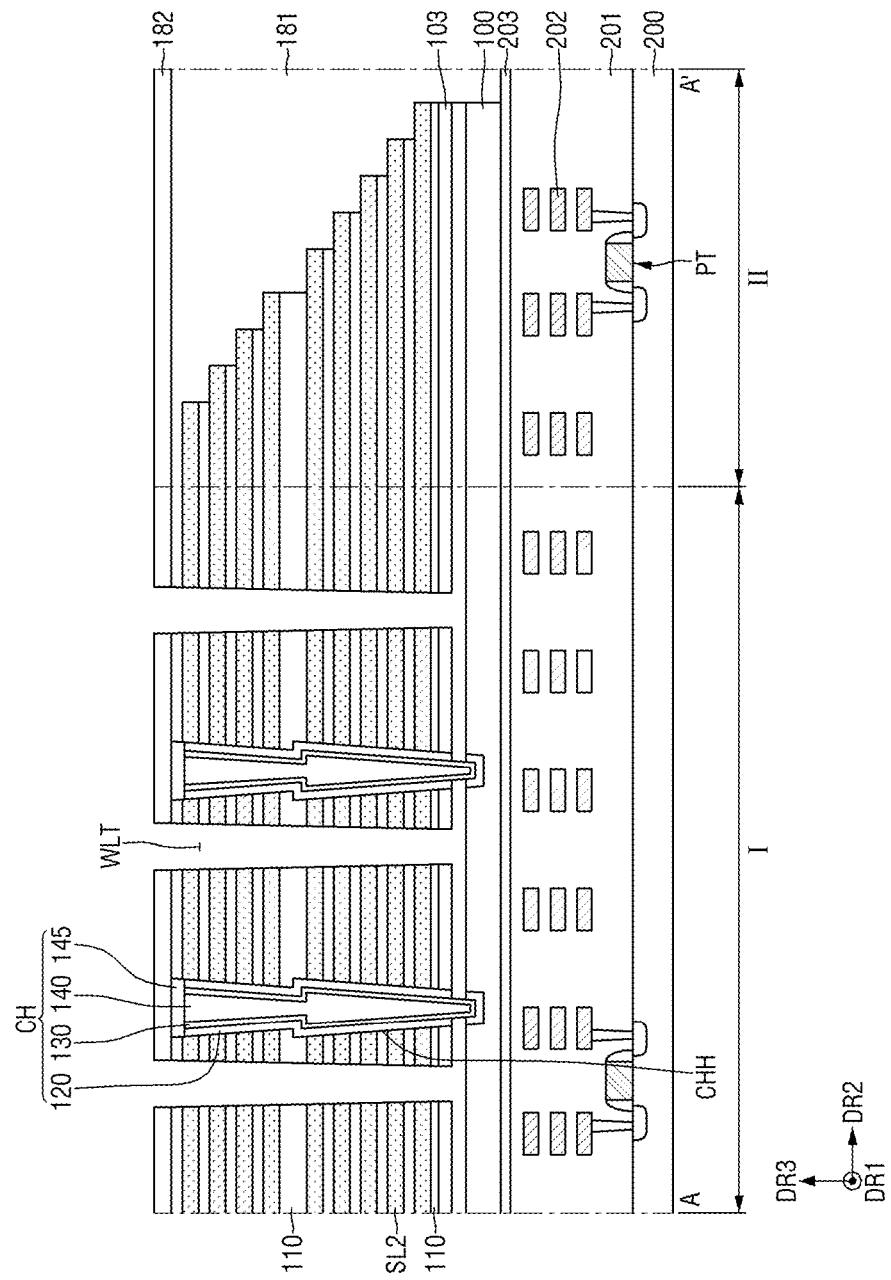

Referring to FIG. 12, the second interlayer insulating layer 182 may be formed on the first interlayer insulating layer 181. Subsequently, a block separation trench WLT that penetrates the second interlayer insulating layer 182, the first interlayer insulating layer 181, the second sacrificial layer SL2, the mold insulating layer 110, and the support layer 103 in the vertical direction DR3 may be formed. The block separation trench WLT may extend in the first horizontal direction DR1. The first sacrificial layer SL1 may be exposed by the block separation trench WLT.

The first sacrificial layer SL1 may then be removed through the block separation trench WLT. Further, the channel layer 130 may be exposed by removing a part of the information storage layer 120 being in contact with the first sacrificial layer SL1. For example, the first sacrificial layer SL1 and the channel layer 130 may be removed through the wet etching process.

Figure 13:
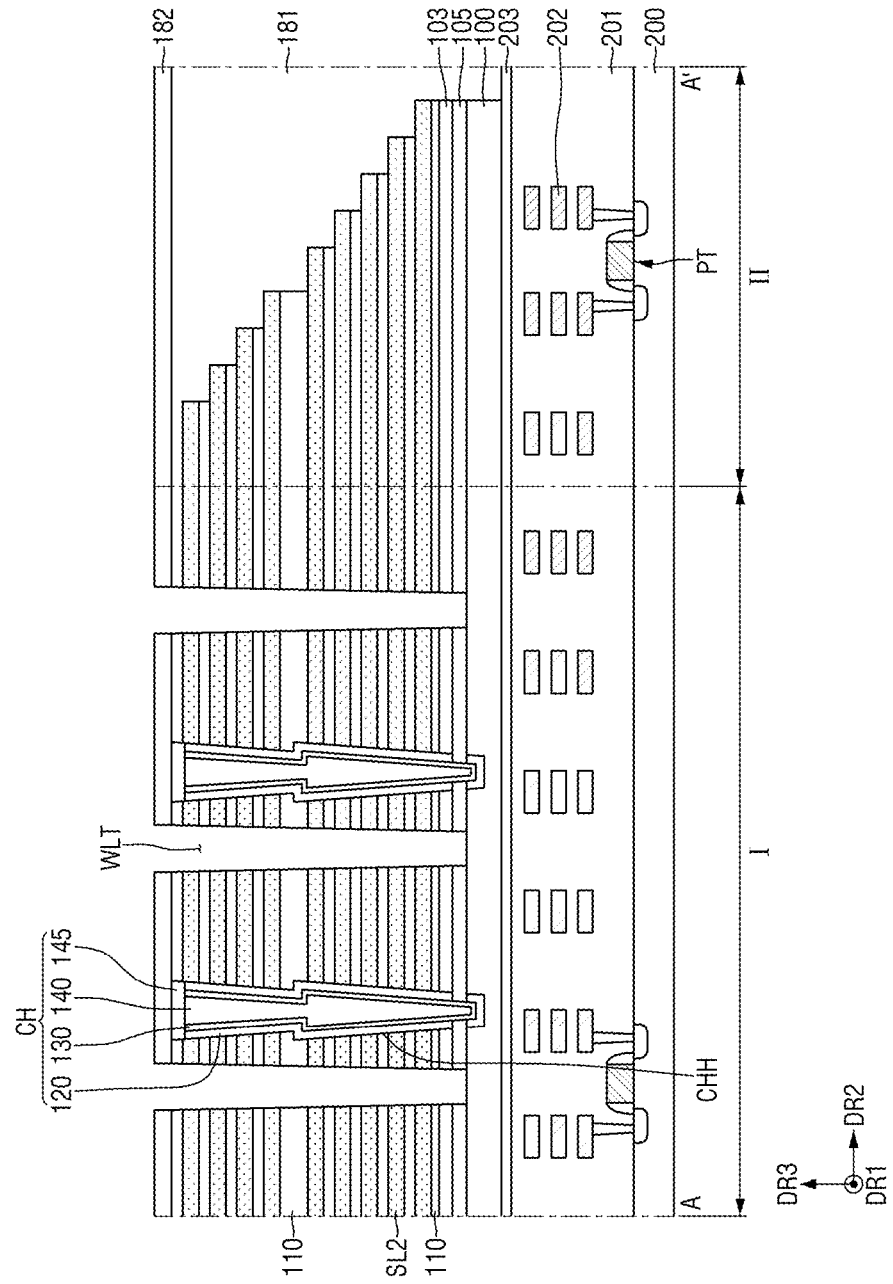

Referring to FIG. 13, the source structure 105 may be formed in the portion from which the first sacrificial layer SL1 is removed.

Figure 14:
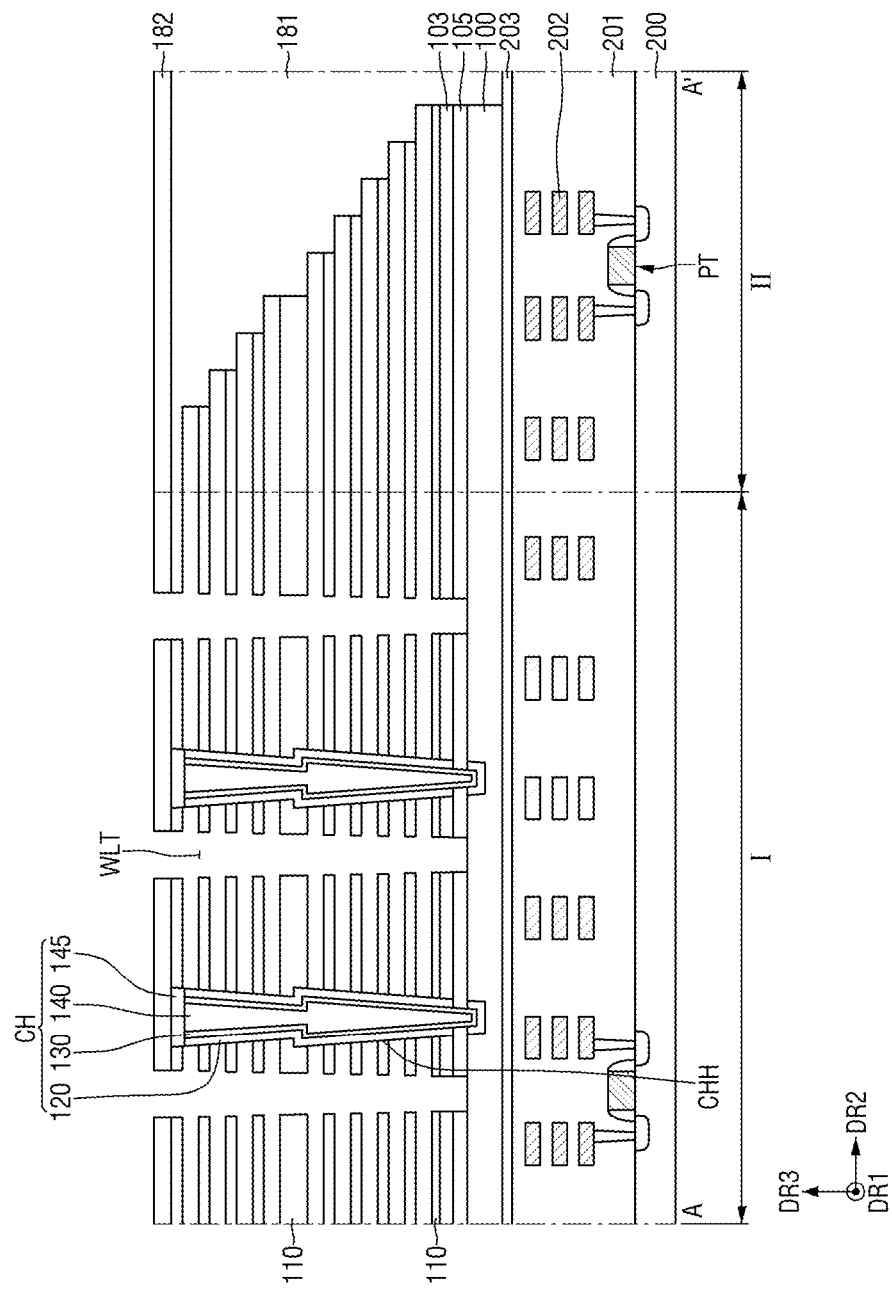

Referring to FIG. 14, the second sacrificial layer SL2 may be removed through the block separation trench WLT. For example, the second sacrificial layer SL2 may be removed through a wet etching process.

Figure 15:
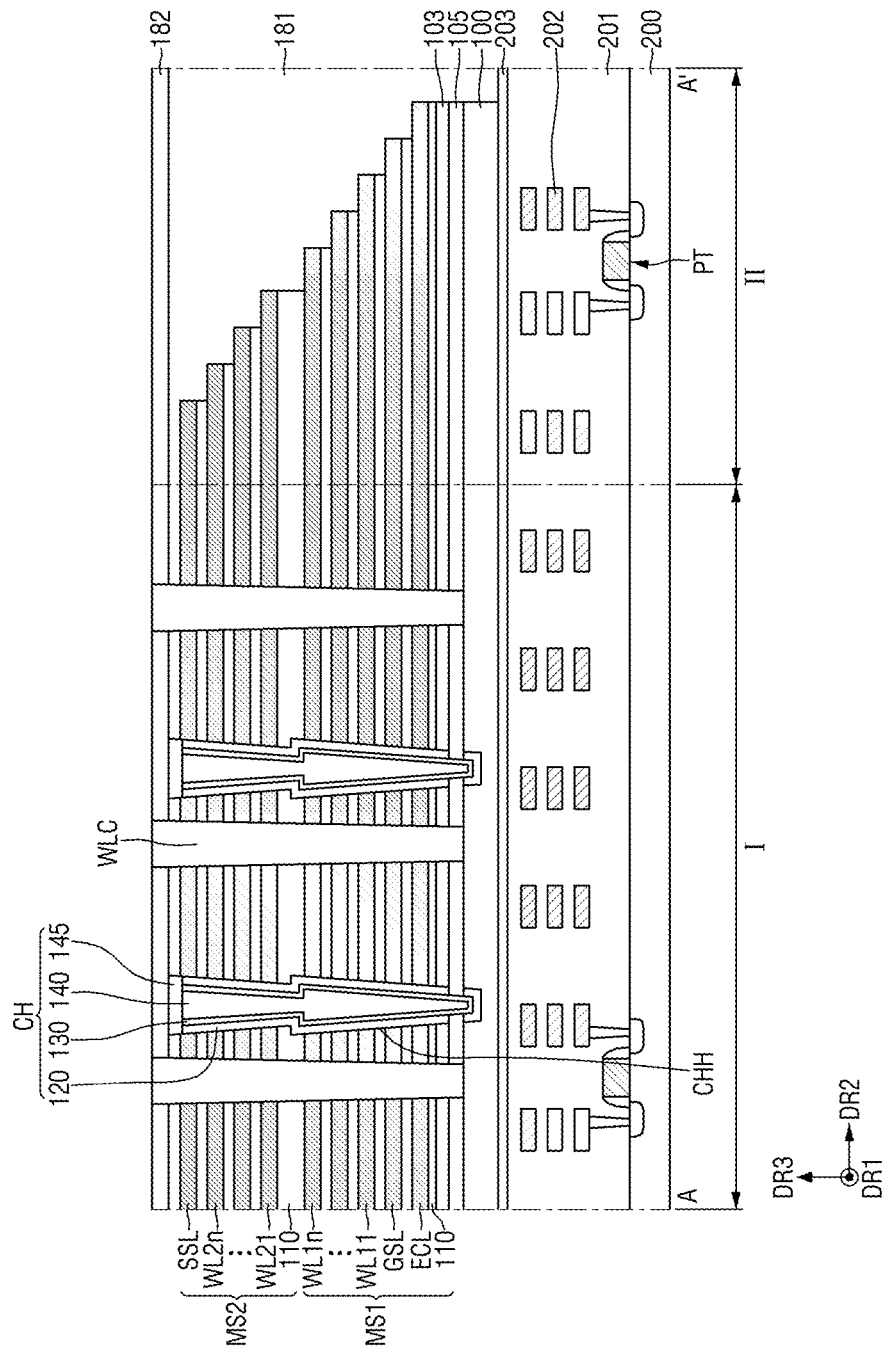

Referring to FIG. 15, a plurality of gate electrodes ECL, GSL, WL11 to WL1n, WL21 to WL2n, and SSL may be formed in the portion from which the second sacrificial layer SL2 is removed. Subsequently, the block separation pattern WLC may be formed inside the block separation trench (WLT of FIG. 14).

Referring to FIG. 4, the third interlayer insulating layer 183 may be formed on the second interlayer insulating layer 182. Subsequently, the bit line contact 190, which penetrates the third interlayer insulating layer 183 and the second interlayer insulating layer 182 in the vertical direction DR3 and is connected to the bit line pad 145, may be formed.

Subsequently, the bit line BL may be formed on the third interlayer insulating layer 183 and the bit line pad 145. A plurality of bit lines BL may be formed to extend in the second horizontal direction DR2 and separate from each other. The bit line BL may be electrically connected to the channel structure CH through the bit line contact 190. Subsequently, the fourth interlayer insulating layer 184 may be formed to cover the bit line BL. The semiconductor memory device shown in FIG. 4 may be fabricated through such a fabricating process.

Hereinafter, a semiconductor memory device according to some other example embodiments of the present inventive concepts will be described referring to FIG. 16. Differences from the semiconductor memory device shown in FIGS. 3 to 5 will be mainly described.

Figure 16:
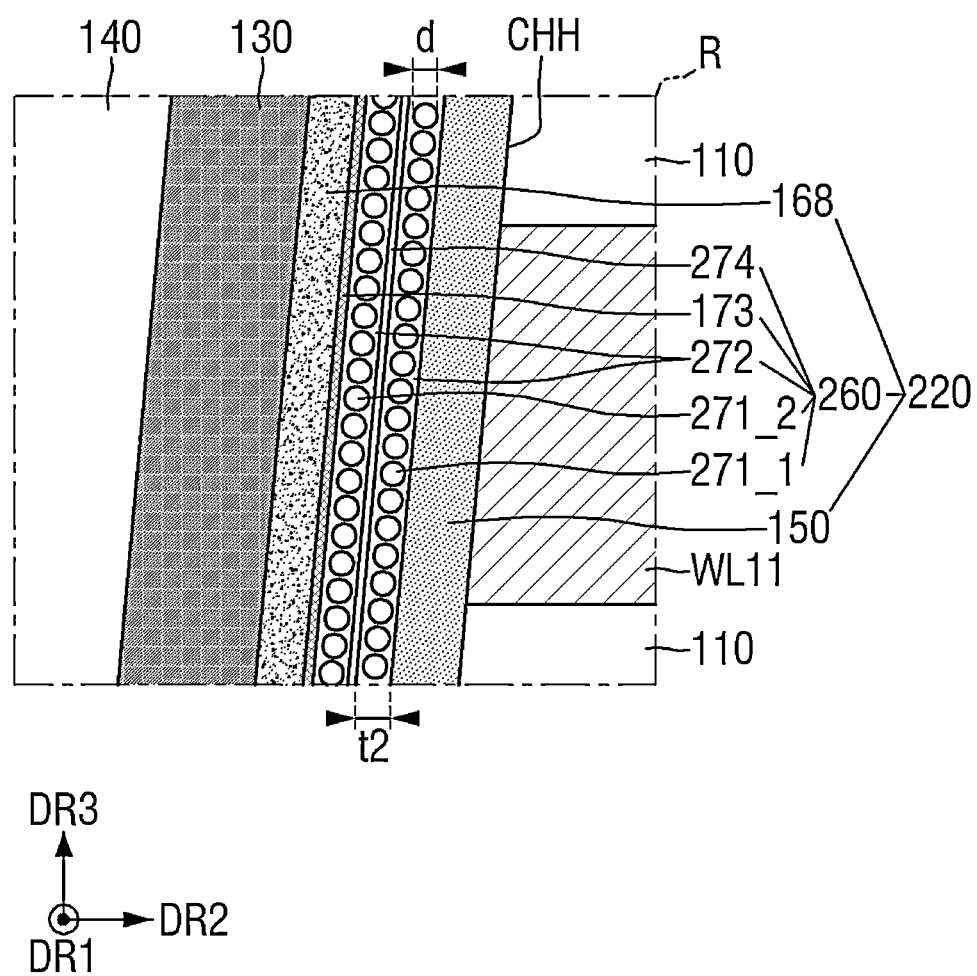
FIG. 16 is an enlarged view for explaining a semiconductor memory device according to some other example embodiments of the present inventive concepts.

FIG. 16 is an enlarged view for explaining a semiconductor memory device according to some other example embodiments of the present inventive concepts.

Referring to FIG. 16, in the semiconductor memory device according to some other example embodiments of the present inventive concepts, the information storage layer 220 may include a blocking insulation layer 150, a charge storage layer 260, and a tunneling insulation layer 168. The charge storage layer 260 may include a first plurality of crystals 271_1, a second plurality of crystals 271_2, a first layer 272, a first barrier layer 173, and a second barrier layer 274.

Each of the first plurality of crystals 271_1 and the second plurality of crystals 271_2 may include spherical hafnium oxide crystals. The first layer 272 may surround each of the first plurality of crystals 271_1 and the second plurality of crystals 271_2.

The second barrier layer 274 may be disposed between the first plurality of crystals 271_1 and the second plurality of crystals 271_2. That is, the second barrier layer 274 may be disposed between the first layer 272 surrounding the first plurality of crystals 271_1 and the first layer 272 surrounding the second plurality of crystals 271_2.

The second barrier layer 274 may include a different material from the first layer 272. The second barrier layer 274 may include a material having a smaller Band GAP than the first layer 272. Further, the second barrier layer 274 may include a material having a greater Band GAP than each of the first and second plurality of crystals 271_2 and 271_2. The second barrier layer 274 may include, for example, silicon nitride. In some other example embodiments, the second barrier layer 274 may include, for example, at least one of silicon oxynitride, silicon carbonitride, and silicon oxycarbonitride, but example embodiments are not limited thereto.

A thickness t2 of the first layer 272 surrounding the first plurality of crystals 271_1 and the first layer 272 surrounding the second plurality of crystals 271_2 may be in, for example, a range of 2 nm to 4 nm (or greater or lesser thicknesses).

Hereinafter, a method for fabricating the semiconductor memory device shown in FIG. 16 will be described referring to FIGS. 17 to 20. Differences from the method for fabricating semiconductor memory device shown in FIGS. 6 to 15 will be mainly described.

Figure 17:
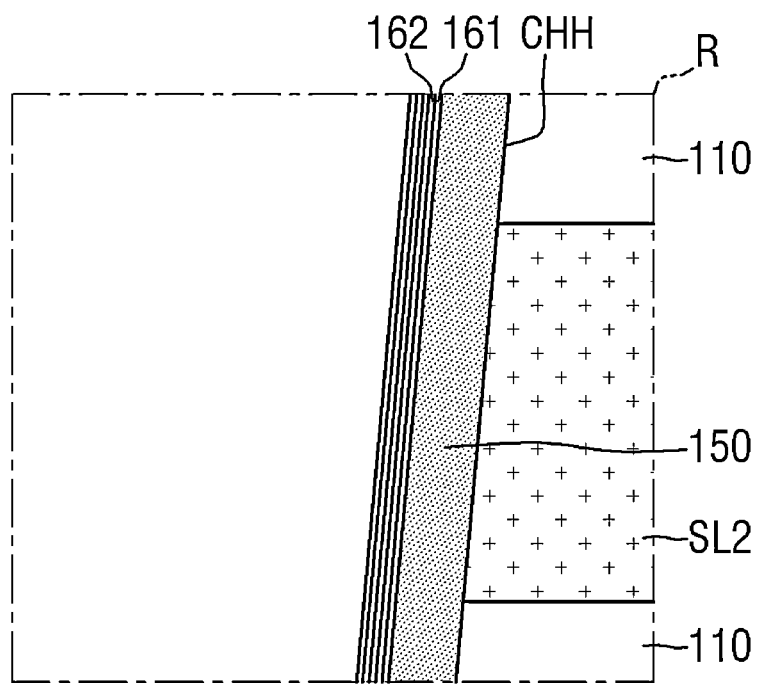
FIGS. 17, 18, 19 and 20 are intermediate step diagrams for explaining the method for fabricating the semiconductor memory device shown in FIG. 16.

Referring to FIG. 17, after performing the fabricating processes shown in FIGS. 5 to 8, a first sub-layer 161 and a second sub-layer 162 may be formed alternately on the blocking insulation layer 150 inside the channel hole CHH.

Figure 18:
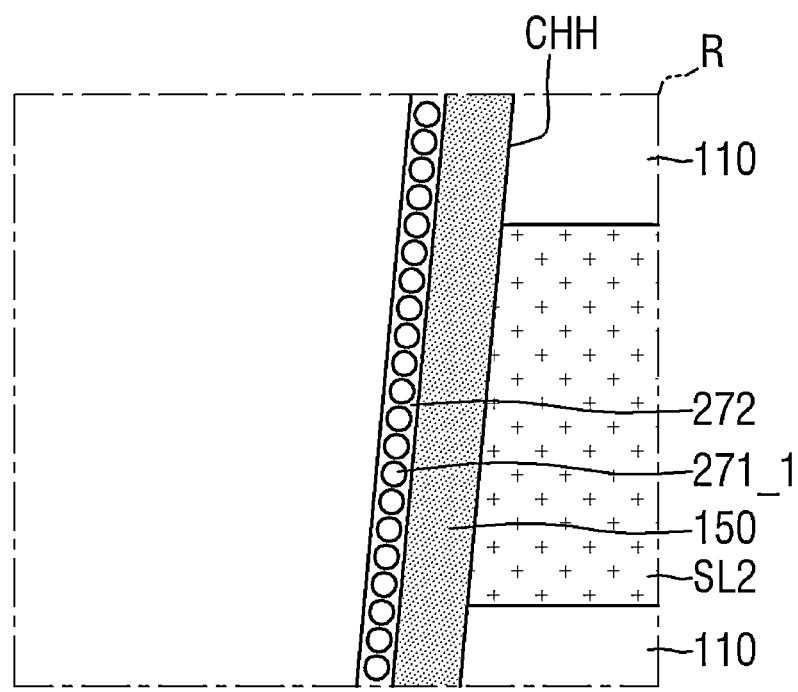
Figure 18:
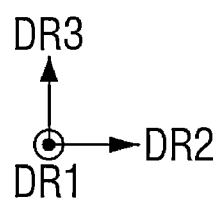

Referring to FIG. 18, a heat treatment process may be performed on the first sub-layer (161 of FIG. 17) and the second sub-layer (162 of FIG. 17) that are alternately stacked. The first sub-layer (161 of FIG. 17) and the second sub-layer (162 of FIG. 17) may be phase-separated through the heat treatment process. Therefore, the first plurality of crystals 271_1 including the hafnium oxide crystals having the spherical shape, and the first layer 272 surrounding the first plurality of crystals 271_1 and including silicon oxide may be formed.

Figure 19:
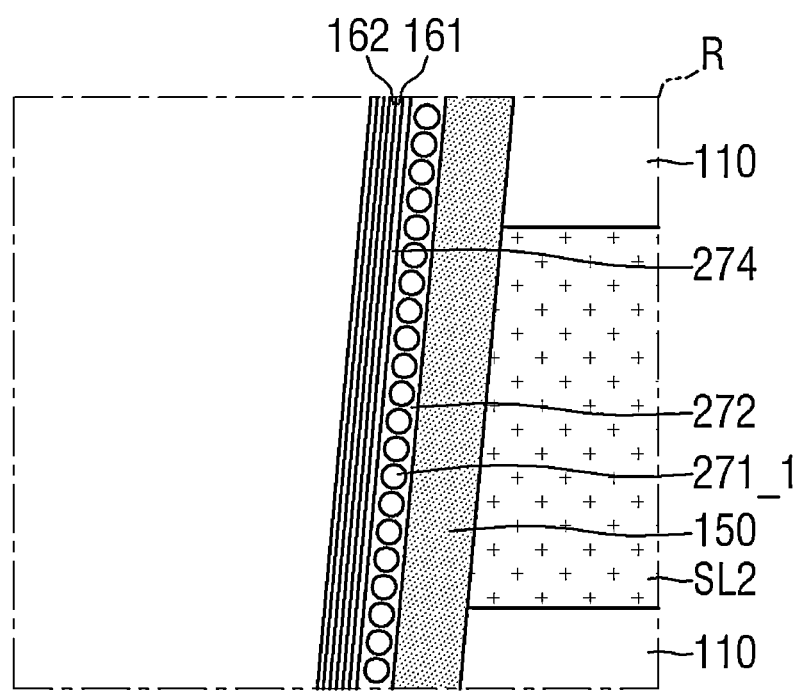

Referring to FIG. 19, the second barrier layer 274 may be formed on the first layer 272 inside the channel hole CHH. Subsequently, the first sub-layer 161 and the second sub-layer 162 may be alternately formed on the second barrier layer 274 inside the channel hole CHH.

Figure 20:
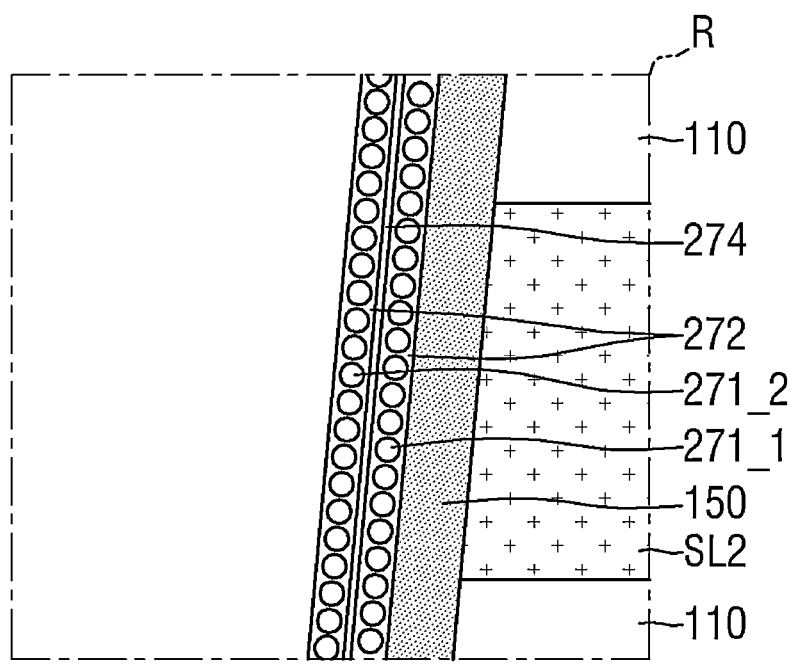
Figure 20:
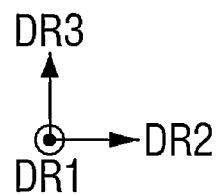

Referring to FIG. 20, a heat treatment process may be performed on the first sub-layer (161 of FIG. 19) and the second sub-layer (162 of FIG. 19) that are alternately stacked. The first sub-layer (161 of FIG. 19) and the second sub-layer (162 of FIG. 19) may be phase-separated through the heat treatment process. Therefore, the second plurality of crystals 271_2 including the hafnium oxide crystals having a spherical shape, and the first layer 272 surrounding the second plurality of crystals 271_2 and including silicon oxide may be formed. Next, the semiconductor memory device shown in FIG. 16 may be fabricated by performing the fabricating processes shown in FIGS. 11 to 15.

Hereinafter, the semiconductor memory device according to some other example embodiments of the present inventive concepts will be described referring to FIG. 21. Differences from the semiconductor memory device shown in FIGS. 3 to 5 will be mainly described.

Figure 21:
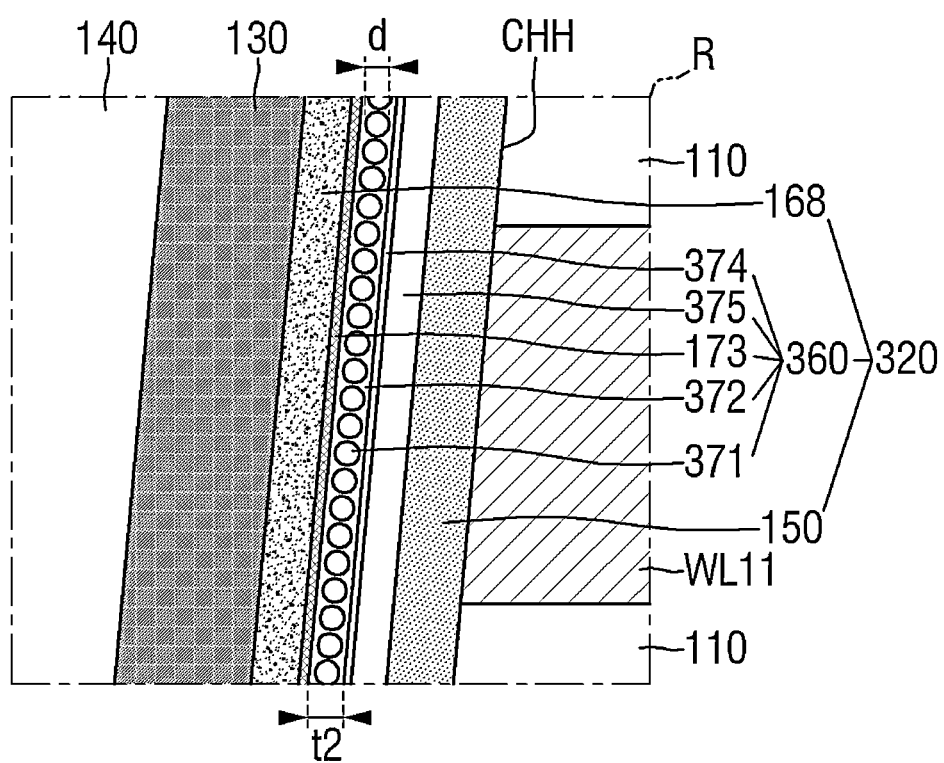
FIG. 21 is an enlarged view for explaining a semiconductor memory device according to still some other example embodiments of the present inventive concepts.

FIG. 21 is an enlarged view for explaining a semiconductor memory device according to still some other example embodiments of the present inventive concepts.

Referring to FIG. 21, in the semiconductor memory device according to some other example embodiments of the present inventive concepts, an information storage layer 320 may include a blocking insulation layer 150, a charge storage layer 360, and a tunneling insulation layer 168. The charge storage layer 360 may include a plurality of crystals 371, a first layer 372, a first barrier layer 173, an interface layer 374, and a second layer 375.

The second layer 375 may be disposed between the first layer 372 and the blocking insulation layer 150. The second layer 375 may include, for example, silicon nitride. The plurality of crystals 371 and the first layer 372 surrounding the plurality of crystals 371 may be disposed between the second layer 375 and the first barrier layer 173. A thickness t2 of the first layer 372 may be in, for example, a range of 2 nm to 4 nm (or greater or lesser thicknesses). The interface layer 374 may be disposed at a boundary between the first layer 372 and the second layer 375. The interface layer 374 may include, for example, silicon oxynitride.

Hereinafter, a method for fabricating the semiconductor memory device shown in FIG. 21 will be described referring to FIGS. 22 and 23. Differences from the methods for fabricating semiconductor memory devices shown in FIGS. 6 to 15 will be mainly described.

Figure 22:
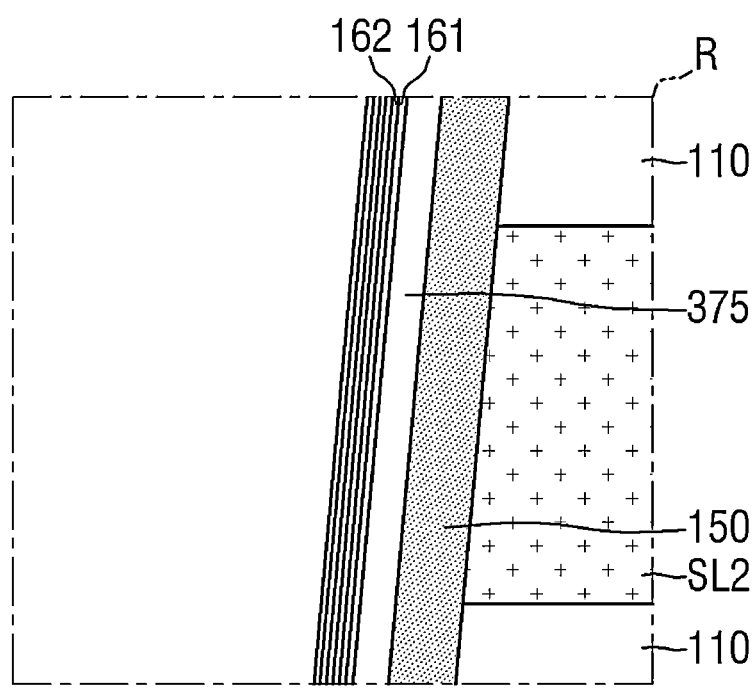
FIGS. 22 and 23 are intermediate step diagrams for explaining the method for fabricating the semiconductor memory device shown in FIG. 21.
Figure 23:
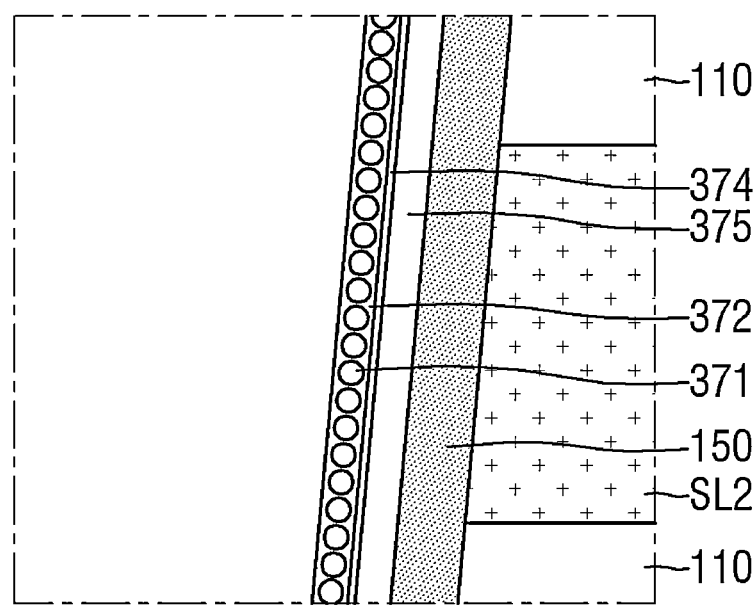
Figure 23:
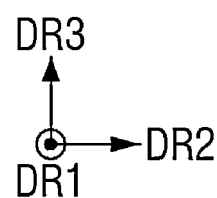

FIGS. 22 and 23 are intermediate step diagrams for explaining the method for fabricating the semiconductor memory device shown in FIG. 21.

Referring to FIG. 22, after performing the fabricating processes shown in FIGS. 5 to 8, the second layer 375 may be formed on the blocking insulation layer 150 inside the channel hole CHH. Subsequently, the first sub-layer 161 and the second sub-layer 162 may be alternately formed on the second layer 375 inside the channel hole CHH.

Referring to FIG. 23, a heat treatment process may be performed on the first sub-layer (161 of FIG. 22) and the second sub-layer (162 of FIG. 22) that are alternately stacked. The first sub-layer (161 of FIG. 22) and the second sub-layer (162 of FIG. 22) may be phase-separated through the heat treatment process. Accordingly, a plurality of crystals 371 including hafnium oxide crystals having a spherical shape, and a first layer 372 surrounding the plurality of crystals 371 and including silicon oxide may be formed. Further, the interface layer 374 may be formed between the first layer 372 and the second layer 375 through the heat treatment process. Subsequently, the fabricating processes shown in FIGS. 11 to 15 may be performed to fabricate the semiconductor memory device shown in FIG. 21.

Hereinafter, a semiconductor memory device according to some other example embodiments of the present disclosure will be described referring to FIG. 24. Differences from the semiconductor memory devices shown in FIGS. 3 to 5 will be mainly described.

Figure 24:
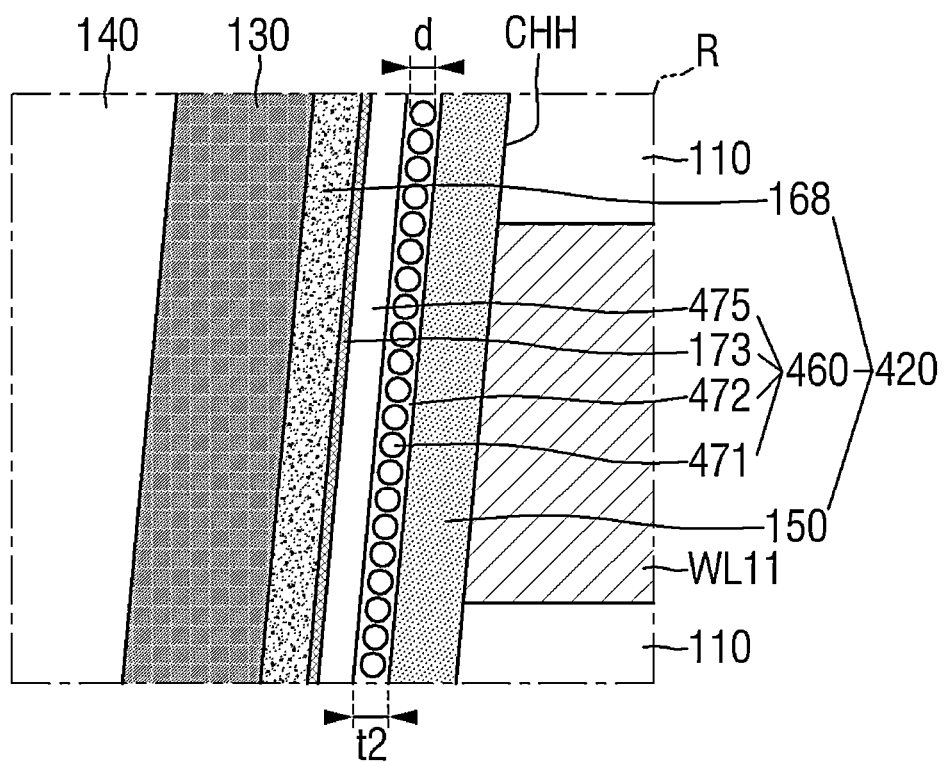
FIG. 24 is an enlarged view for explaining a semiconductor memory device according to still some other example embodiments of the present inventive concepts.

FIG. 24 is an enlarged view for explaining a semiconductor memory device according to still some other example embodiments of the present inventive concepts.

Referring to FIG. 24, in the semiconductor memory device according to some other example embodiments of the present disclosure, an information storage layer 420 may include a blocking insulation layer 150, a charge storage layer 460, and a tunneling insulation layer 168. The charge storage layer 460 may include a plurality of crystals 471, a first layer 472, a first barrier layer 173, and a second layer 475.

The second layer 475 may be disposed between the first layer 372 and the first barrier layer 173. The second layer 475 may include, for example, silicon nitride. The plurality of crystals 471 and the first layer 472 surrounding the plurality of crystals 471 may be disposed between the blocking insulation layer 150 and the second layer 475. The second layer 475 may be in contact with the first layer 472. A thickness t2 of the first layer 472 may be in, for example, a range of 2 nm to 4 nm (or greater or lesser thicknesses).

Hereinafter, a method for fabricating the semiconductor memory device shown in FIG. 24 will be described referring to FIGS. 25 and 26. Differences from the method for fabricating the semiconductor memory device shown in FIGS. 6 to 15 will be mainly described.

Figure 25:
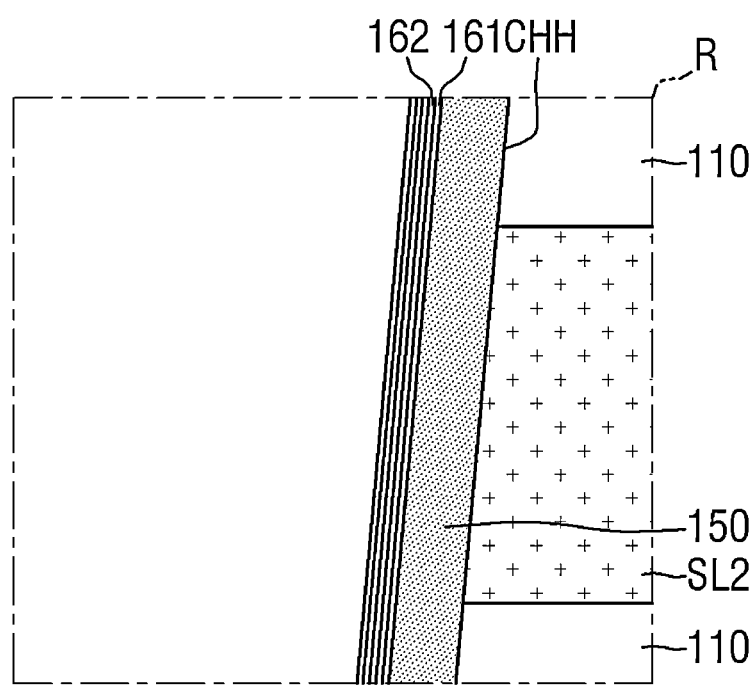
FIGS. 25 and 26 are intermediate step diagrams for explaining the method for fabricating the semiconductor memory device shown in FIG. 24.
Figure 25:
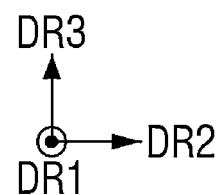
Figure 26:
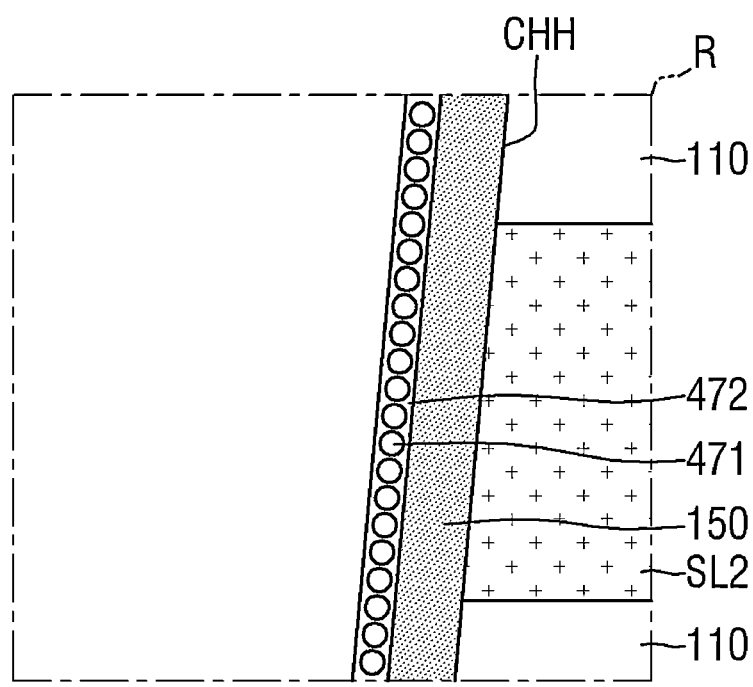
Figure 26:
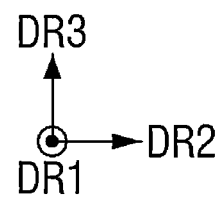

FIGS. 25 and 26 are intermediate step diagrams for explaining a method for fabricating the semiconductor memory device shown in FIG. 24.

Referring to FIG. 25, after performing the fabricating processes shown in FIGS. 5 to 8, the first sub-layer 161 and the second sub-layer 162 may be formed alternately on the blocking insulation layer 150 inside the channel hole CHH.

Referring to FIG. 26, a heat treatment process may be performed on the first sub-layer (161 of FIG. 25) and the second sub-layer (162 of FIG. 25) that are alternately stacked. The first sub-layer (161 of FIG. 25) and the second sub-layer (162 of FIG. 25) may be phase-separated through the heat treatment process. Accordingly, a plurality of crystals 471 including hafnium oxide crystals having a spherical shape, and a first layer 472 surrounding the plurality of crystals 471 and including silicon oxide may be formed.

Subsequently, after the second layer 475 is formed on the first layer 472 inside the channel hole CHH, the fabricating processes shown in FIGS. 11 to 15 may be performed to fabricate the semiconductor memory device shown in FIG. 24.

Hereinafter, a semiconductor memory device according to some other example embodiments of the present inventive concepts will be described referring to FIG. 27. Differences from the semiconductor memory device shown in FIG. 24 will be mainly described.

Figure 27:
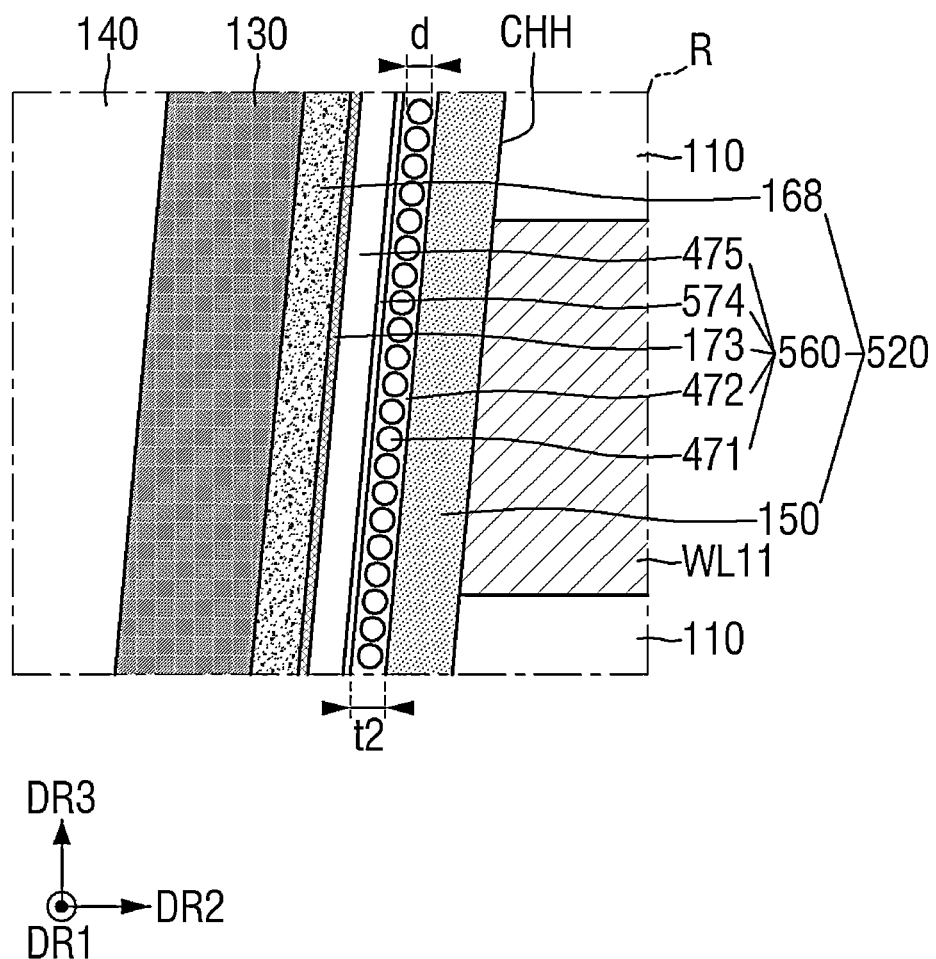
FIG. 27 is an enlarged view for explaining a semiconductor memory device according to still some other example embodiments of the present inventive concepts.

FIG. 27 is an enlarged view for explaining a semiconductor memory device according to still some other example embodiments of the present inventive concepts.

Referring to FIG. 27, in the semiconductor memory device according to some other example embodiments of the present inventive concepts, an information storage layer 520 may include a blocking insulation layer 150, a charge storage layer 560, and a tunneling insulation layer 168. The charge storage layer 560 may include a plurality of crystals 471, a first layer 472, a first barrier layer 173, an interface layer 574, and a second layer 475. The interface layer 574 may be disposed at a boundary between the first layer 472 and the second layer 475. The interface layer 574 may include, for example, silicon oxynitride.

Hereinafter, a semiconductor memory device according to some other example embodiments of the present inventive concepts will be described referring to FIG. 28. Differences from the semiconductor memory device shown in FIGS. 3 to 5 will be mainly described.

Figure 28:
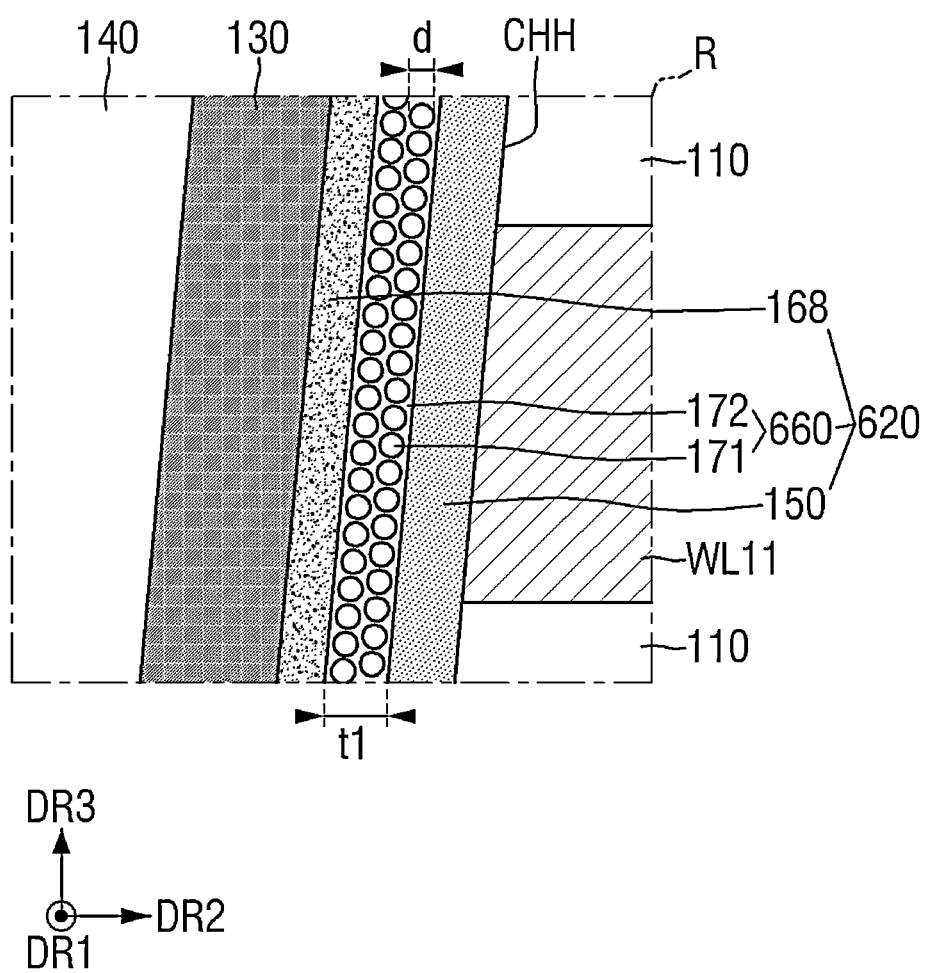
FIG. 28 is an enlarged view for explaining a semiconductor memory device according to still some other example embodiments of the present inventive concepts.

FIG. 28 is an enlarged view for explaining a semiconductor memory device according to still some other example embodiments of the present inventive concepts.

Referring to FIG. 28, in the semiconductor memory device according to still some other example embodiments of the present inventive concepts, an information storage layer 620 may include a blocking insulation layer 150, a charge storage layer 660, and a tunneling insulation layer 168. The charge storage layer 660 may include a plurality of crystals 171 and a first layer 172. The first layer 172 may be in contact with the tunneling insulation layer 168.

Hereinafter, a semiconductor memory device according to some other example embodiments of the present inventive concepts will be described referring to FIG. 29. Differences from the semiconductor memory device shown in FIG. 16 will be mainly described.

Figure 29:
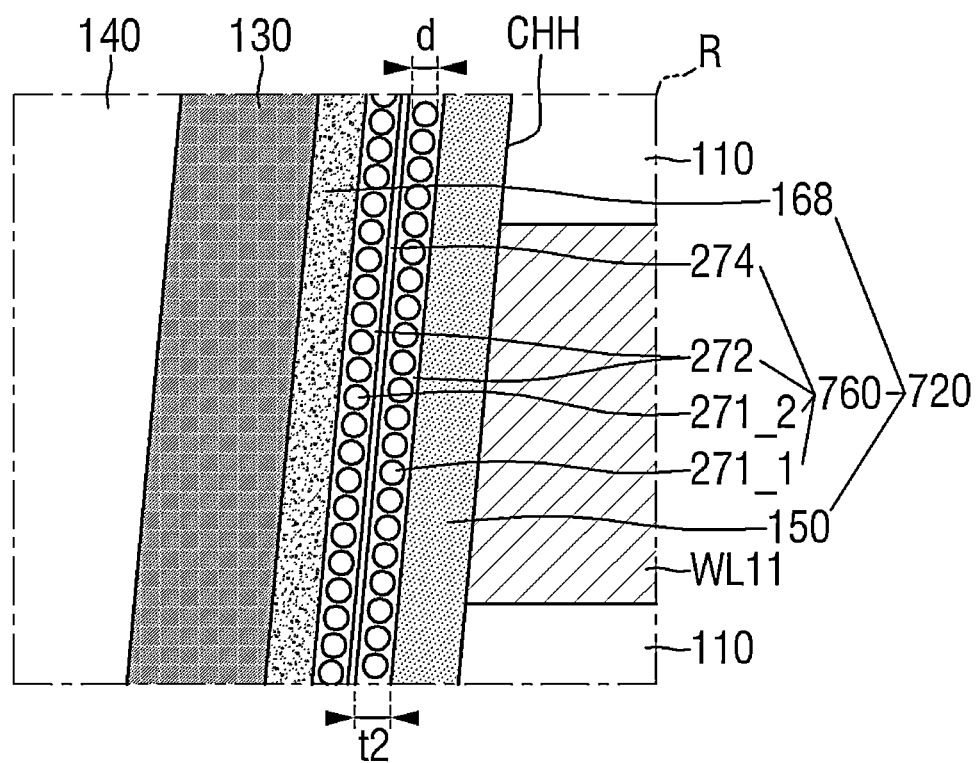
FIG. 29 is an enlarged view for explaining a semiconductor memory device according to still some other example embodiments of the present inventive concepts.

FIG. 29 is an enlarged view for explaining a semiconductor memory device according to still some other example embodiments of the present inventive concepts.

Referring to FIG. 29, in the semiconductor memory device according to some other example embodiments of the present inventive concepts, an information storage layer 720 may include a blocking insulation layer 150, a charge storage layer 760, and a tunneling insulation layer 168. The charge storage layer 760 may include a first plurality of crystals 271_1, a second plurality of crystals 271_2, a first layer 272, and a second barrier layer 274. The first layer 272 surrounding the second plurality of crystals 271_2 may be in contact with the tunneling insulation layer 168.

Hereinafter, a semiconductor memory device according to some other example embodiments of the present inventive concepts will be described referring to FIG. 30. Differences from the semiconductor memory device shown in FIG. 21 will be mainly described.

Figure 30:
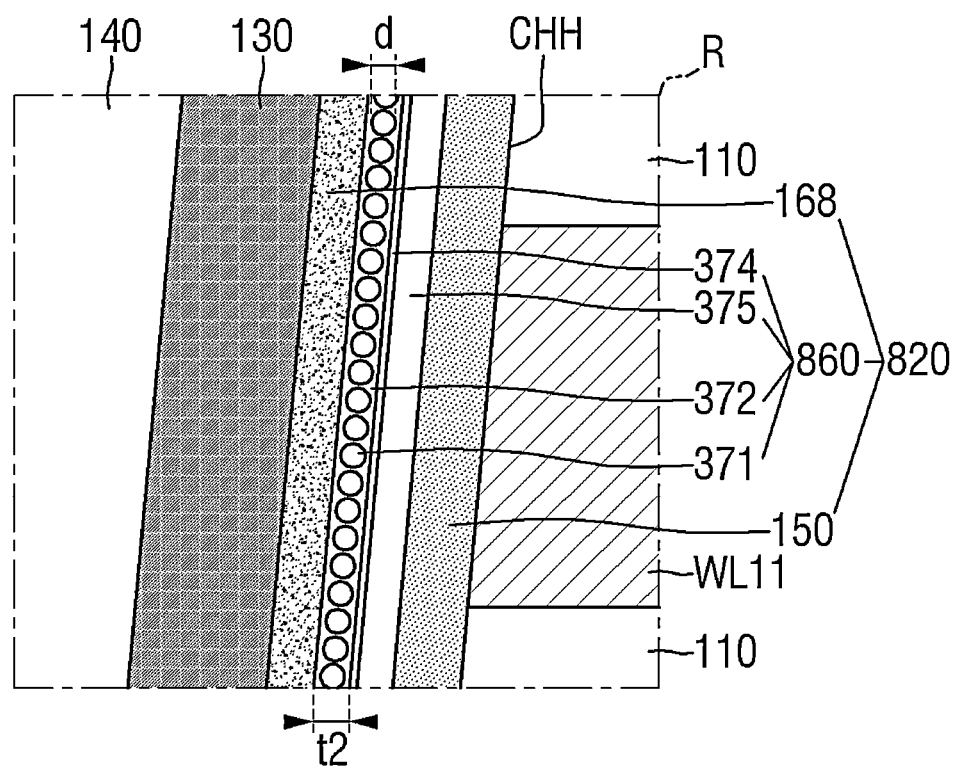
FIG. 30 is an enlarged view for explaining a semiconductor memory device according to still some other example embodiments of the present inventive concepts.

FIG. 30 is an enlarged view for explaining a semiconductor memory device according to still some other example embodiments of the present inventive concepts.

Referring to FIG. 30, in the semiconductor memory device according to some other example embodiments of the present inventive concepts, an information storage layer 820 may include a blocking insulation layer 150, a charge storage layer 860, and a tunneling insulation layer 168. The charge storage layer 860 may include a plurality of crystals 371, a first layer 372, an interface layer 374, and a second layer 375. The first layer 372 may be in contact with the tunneling insulation layer 168.

Hereinafter, a semiconductor memory device according to some other example embodiments of the present inventive concepts will be described referring to FIG. 31. Differences from the semiconductor memory device shown in FIG. 24 will be mainly described.

Figure 31:
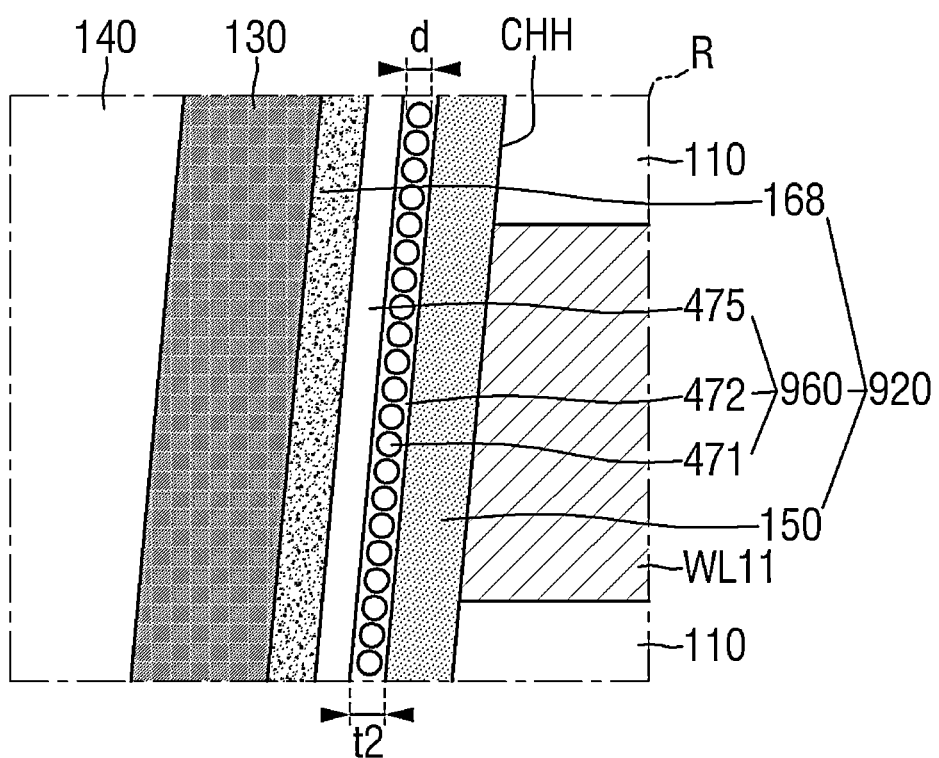
FIG. 31 is an enlarged view for explaining a semiconductor memory device according to still some other example embodiments of the present inventive concepts.

FIG. 31 is an enlarged view for explaining a semiconductor memory device according to still some other example embodiments of the present inventive concepts.

Referring to FIG. 31, in a semiconductor memory device according to some other example embodiments of the present inventive concepts, an information storage layer 920 may include a blocking insulation layer 150, a charge storage layer 960, and a tunneling insulation layer 168. The charge storage layer 960 may include a plurality of crystals 471, a first layer 472, and a second layer 475. The second layer 475 may be in contact with the tunneling insulation layer 168.

Hereinafter, a semiconductor memory device according to some other example embodiments of the present inventive concepts will be described referring to FIG. 32. Differences from the semiconductor memory device shown in FIG. 27 will be mainly described.

Figure 32:
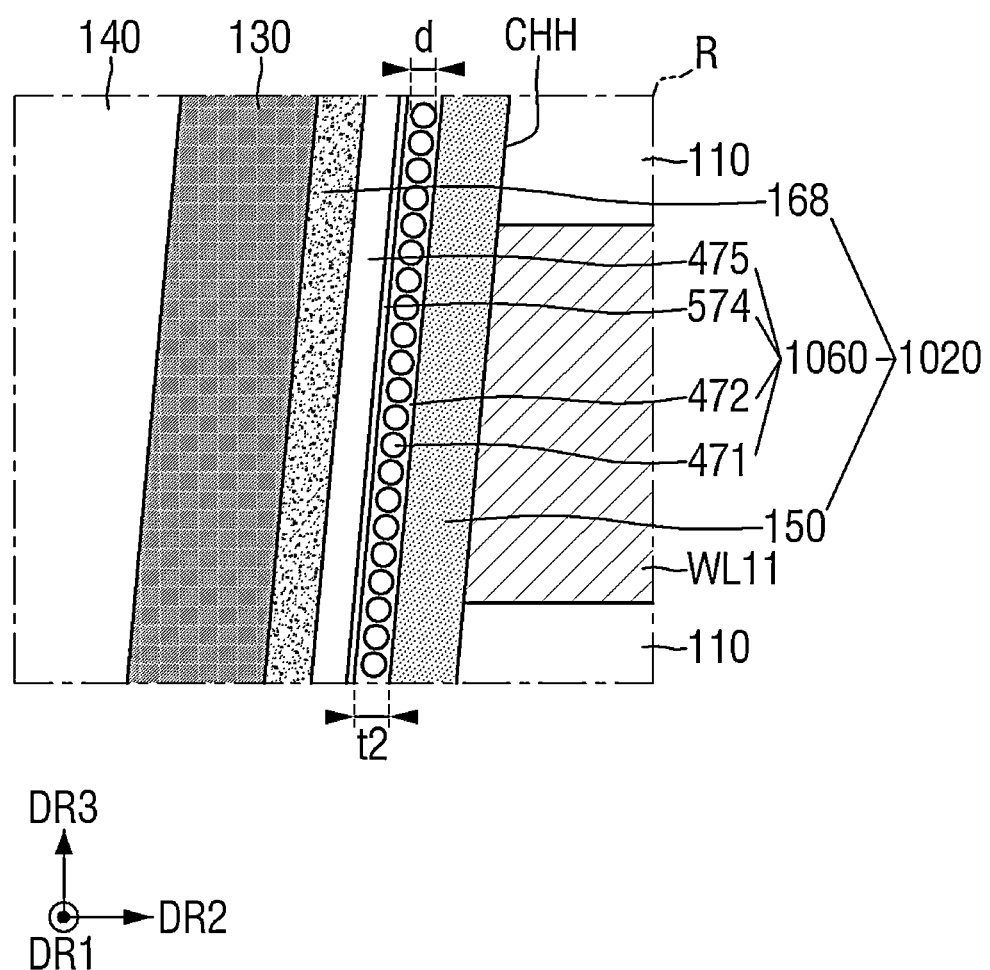
FIG. 32 is an enlarged view for explaining a semiconductor memory device according to still some other example embodiments of the present inventive concepts.

FIG. 32 is an enlarged view for explaining a semiconductor memory device according to still some other example embodiments of the present inventive concepts.

Referring to FIG. 32, in the semiconductor memory device according to some other example embodiments of the present inventive concepts, an information storage layer 1020 may include a blocking insulation layer 150, a charge storage layer 1060, and a tunneling insulation layer 168. The charge storage layer 1060 may include a plurality of crystals 471, a first layer 472, an interface layer 574, and a second layer 475. The second layer 475 may be in contact with the tunneling insulation layer 168.

Hereinafter, a semiconductor memory device according to some other example embodiments of the present inventive concepts will be described referring to FIG. 33. Differences from the semiconductor memory devices shown in FIGS. 3 to 5 will be mainly described.

Figure 33:
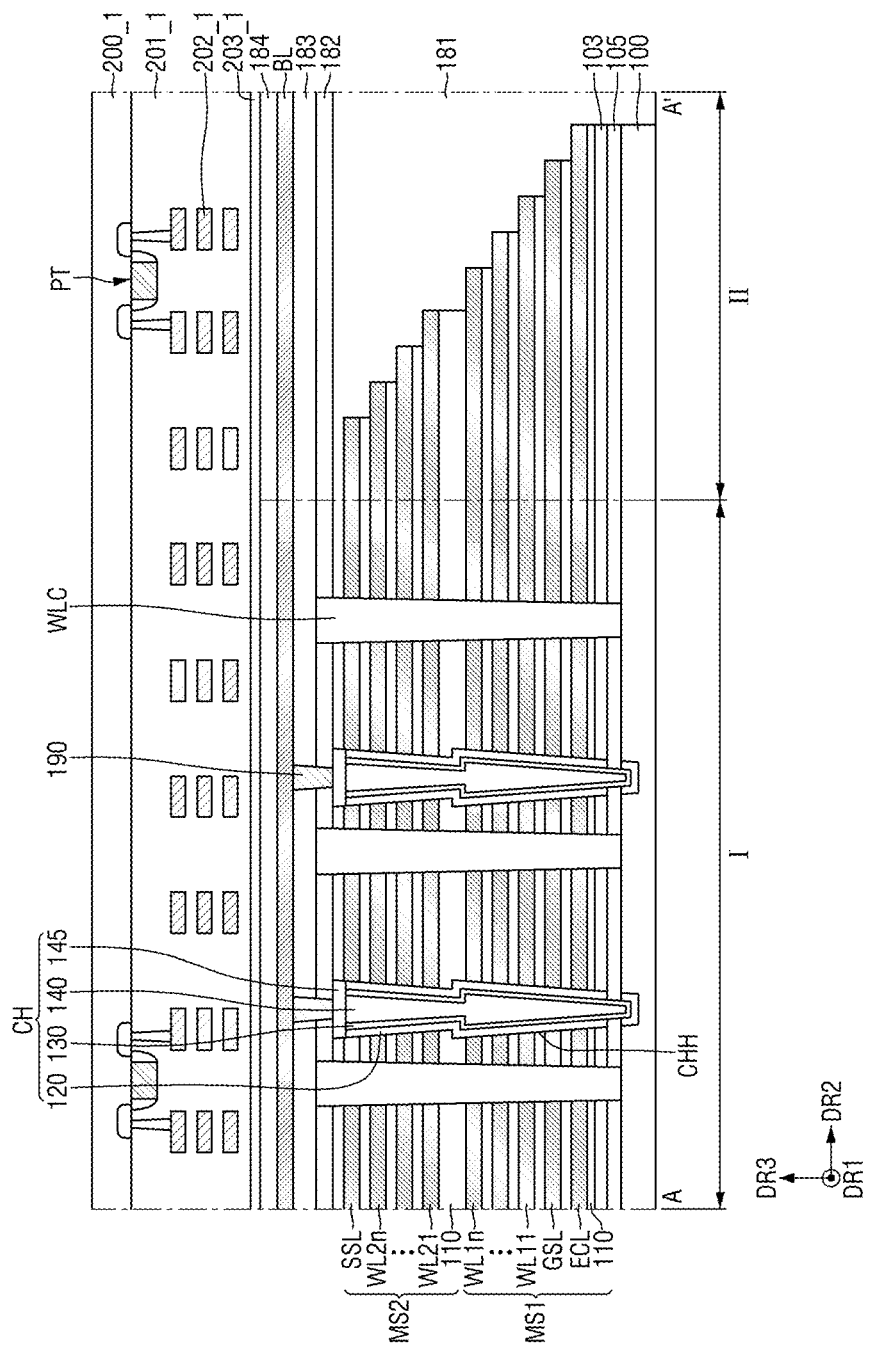
FIG. 33 is a cross-sectional view for explaining a semiconductor memory device according to still some other example embodiments of the present inventive concepts.

FIG. 33 is an enlarged view for explaining a semiconductor memory device according to still some other example embodiments of the present inventive concepts.

Referring to FIG. 33, in the semiconductor memory device according to some other example embodiments of the present inventive concepts, a peripheral circuit region may be disposed on the bit line BL. The peripheral circuit region may include a second substrate 200_1, a peripheral circuit element PT, a fifth interlayer insulating layer 201_1, a wiring pattern 202_1, and an insulating liner 203_1.

The second substrate 200_1 may be disposed on the bit line BL. The peripheral circuit element PT may be disposed on the lower surface of the second substrate 200_1. The fifth interlayer insulating layer 201_1 may be disposed between the fourth interlayer insulating layer 184 and the lower surface of the second substrate 200_1. The fifth interlayer insulating layer 201_1 may cover the peripheral circuit element PT. The wiring pattern 202_1 may be disposed inside the fifth interlayer insulating layer 201_1. The wiring pattern 202_1 may be electrically connected to the peripheral circuit element PT. The insulating liner 203_1 may be disposed between the fourth interlayer insulating layer 184 and the fifth interlayer insulating layer 201_1.

Figure 34:
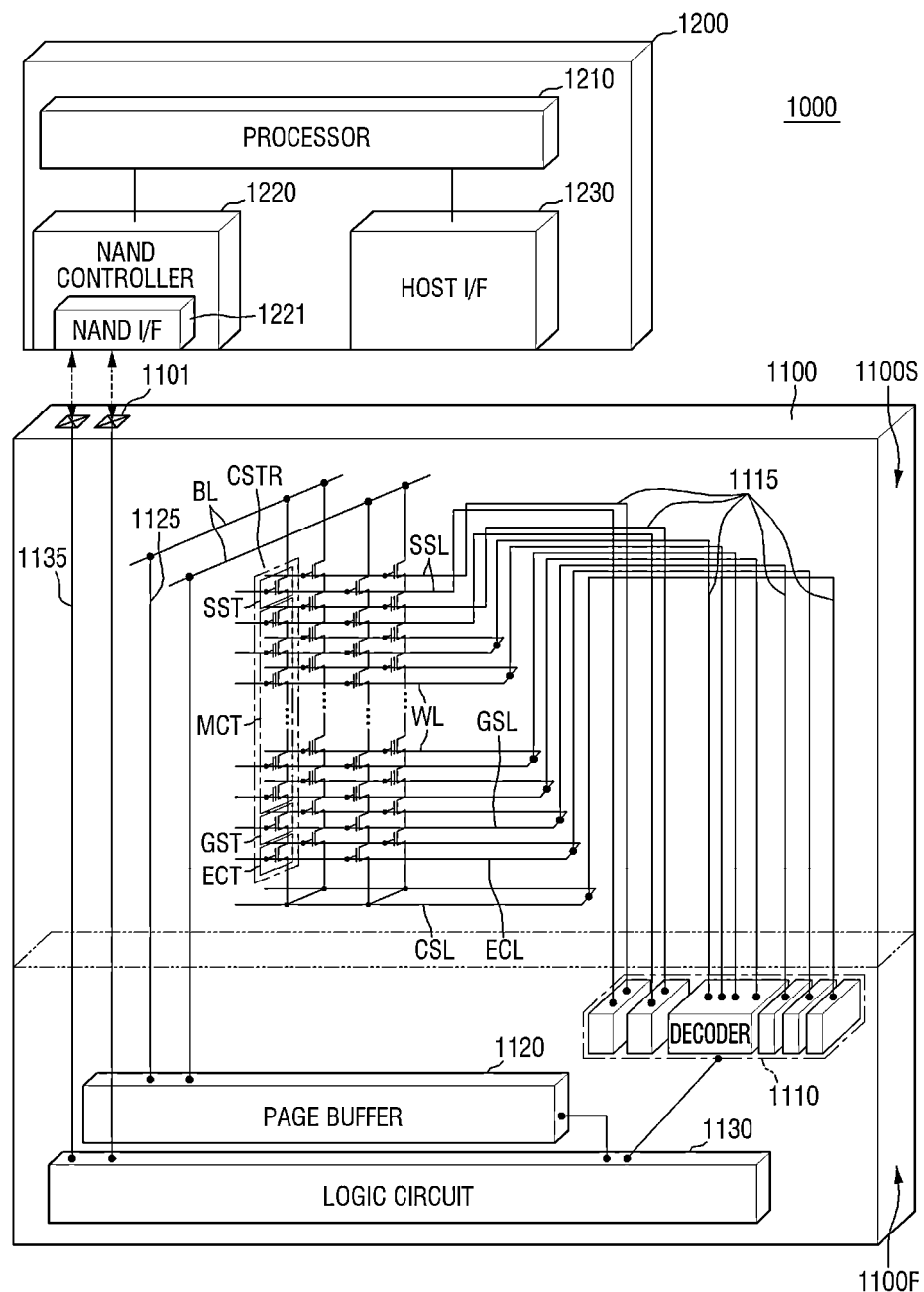
FIG. 34 is a block diagram for explaining an electronic system including a semiconductor memory device according to some example embodiments of the present inventive concepts.
Figure 35:
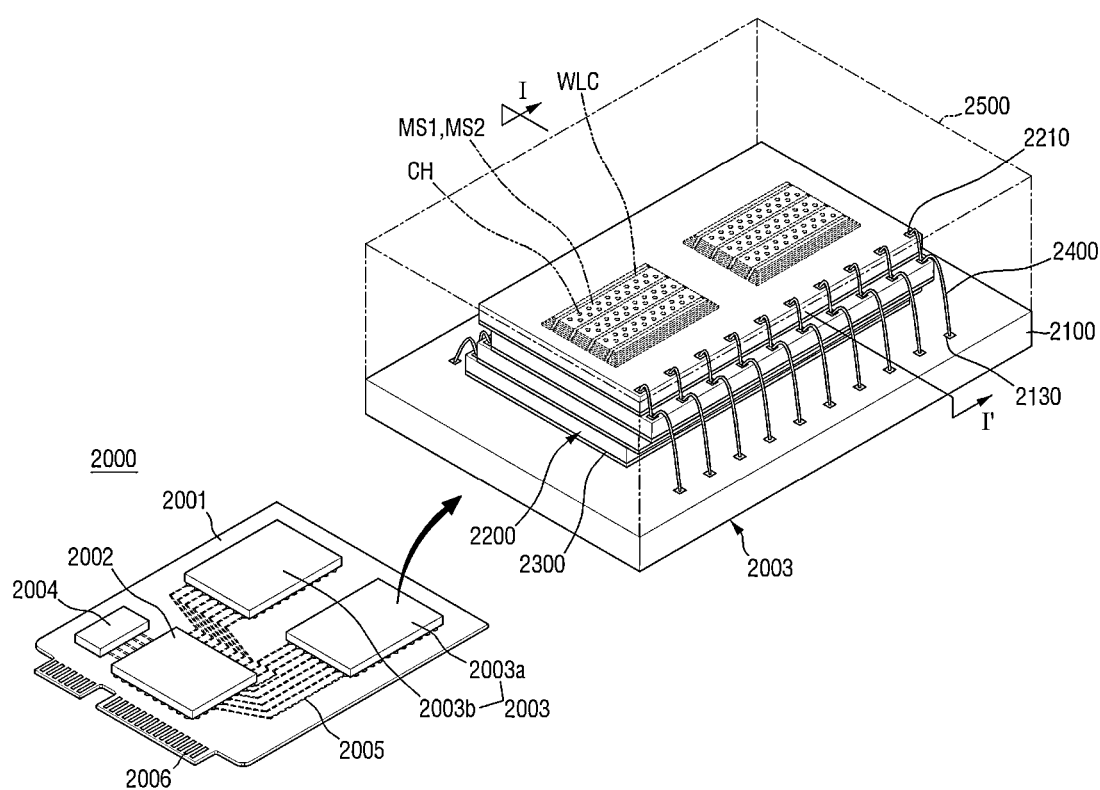
FIG. 35 is a perspective view for explaining an electronic system including a semiconductor memory device according to some example embodiments of the present inventive concepts.
Figure 36:
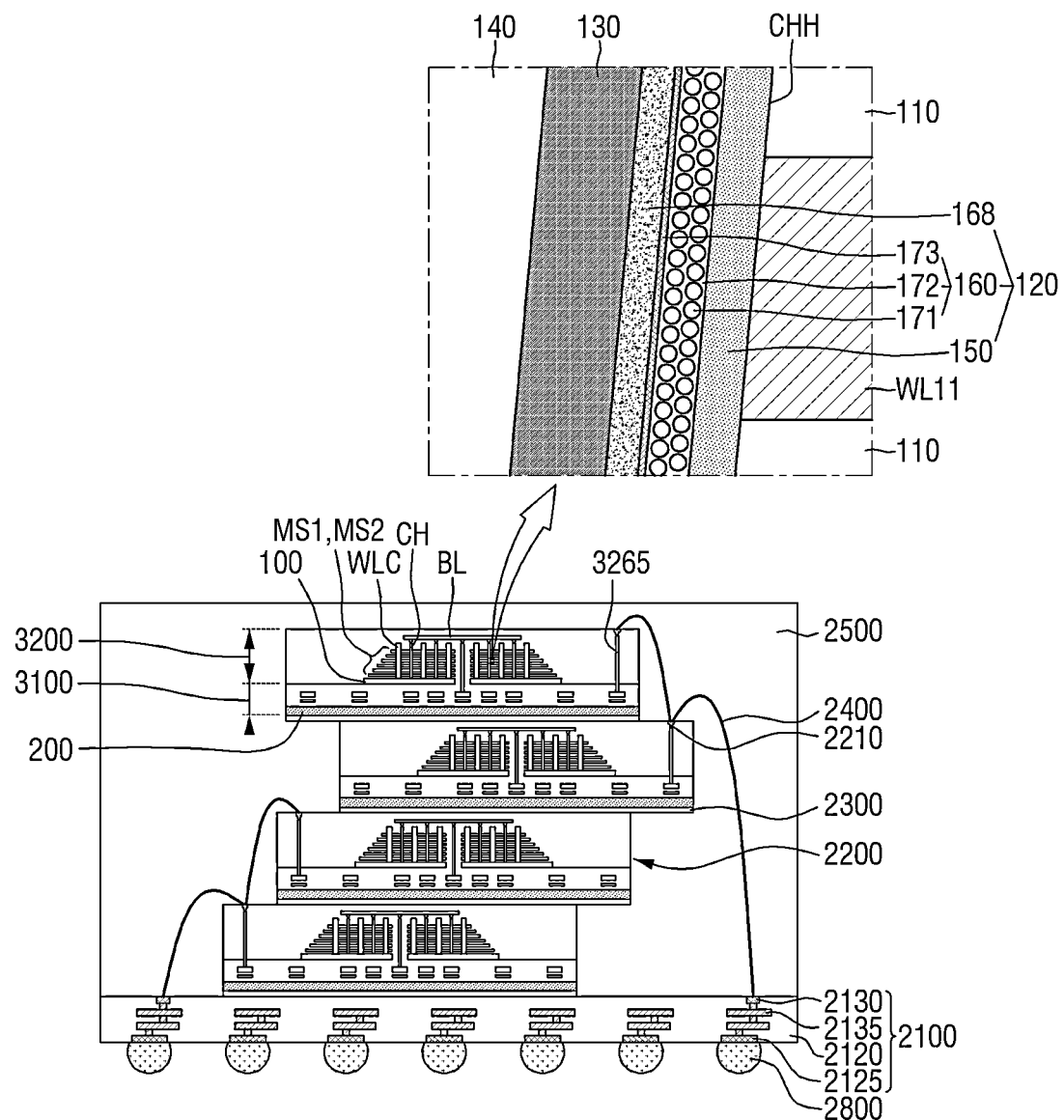
FIG. 36 is a cross-sectional view taken along a line I-I' of FIG. 35.

FIG. 34 is a block diagram for explaining an electronic system including a semiconductor memory device according to some example embodiments of the present inventive concepts. FIG. 35 is a perspective view for explaining an electronic system including a semiconductor memory device according to some example embodiments of the present inventive concepts. FIG. 36 is a cross-sectional view taken along a line I-I' of FIG. 35.

Referring to FIG. 34, an electronic system 1000 according to some example embodiments may include a semiconductor memory device 1100, and a controller 1200 that is electrically connected to the semiconductor memory device 1100. The electronic system 1000 may be a storage device that includes one or multiple semiconductor memory devices 1100, an electronic device that includes the storage device, etc. For example, the electronic system 1000 may be an SSD device (solid state drive device), a USB (Universal Serial Bus), a computing system, a medical device a communication device that includes one or multiple semiconductor memory devices 1100, etc.

The semiconductor memory device 1100 may be a non-volatile memory device (e.g., a NAND flash memory device), and may be, for example, the semiconductor memory device explained above using FIGS. 1 to 33. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include a common source line CSL, a plurality of bit lines BL, and a plurality of cell strings CSTR described above using FIG. 2. The cell strings CSTR may be connected to the decoder circuit 1110 through the word line WL, at least one string selection line SSL, and at least one ground selection line GSL. Further, the cell strings CSTR may be connected to the page buffer 1120 through the bit lines BL.

In some example embodiments, the common source line CSL and the cell strings CSTR may be electrically connected to the decoder circuit 1110 through first connection wirings 1115 extending from the first structure 1100F to the second structure 1100S. In some embodiments, the bit lines BL may be electrically connected to the page buffer 1120 through second connection wirings 1125 extending from the first structure 1100F to the second structure 1100S.

The semiconductor memory device 1100 may communicate with the controller 1200 through an input/output pad 1101 electrically connected to the logic circuit 1130 (e.g., the control logic 37 of FIG. 1). The input/output pad 1101 may be electrically connected to the logic circuit 1130 through an input/output connection wiring 1135 extending from the inside of the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a desired (or, alternatively predetermined) firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor memory device 1100 in response to the control command.

Referring to FIGS. 35 and 36, the electronic system according to some embodiments may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the electronic system 2000 and the external host. In some example embodiments, the electronic system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage), but example embodiments are not limited thereto. In some example embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, semiconductor chips 2200 on the package substrate 2100, adhesive layers 2300 disposed on the lower surfaces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes upper pads 2130. Each semiconductor chip 2200 may include an input/output pad 1101. The input/output pad 2210 may correspond to the input/output pad 2210 of FIG. 34.

In some example embodiments, the connecting structure 2400 may be a bonding wire that electrically connects the input/output pad 2210 and the package upper pads 2130. Therefore, in each of the first semiconductor package 2003a and the second semiconductor package 2003b, the semiconductor chips 2200 may be electrically connected to each other in a bonding wire type, and may be electrically connected to the package upper pads 2130 of the package substrate 2100. In some example embodiments, in each of the first semiconductor package 2003a and the second semiconductor package 2003b, the semiconductor chips 2200 may be electrically connected to each other by a connecting structure including a through electrode (Through Silicon Via, TSV) instead of the connecting structure 2400 of a bonding wire type.

In some example embodiments, the main controller 2002 and the semiconductor chips 2200 may also be included in a single package. In some example embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

In some example embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and inner wirings 2135 that electrically connect the upper pads 2130 and the lower pads 2125 inside the package substrate body portion 2120. The upper pads 2130 may be electrically connected to the connecting structure 2400. The lower pads 2125 may be connected to the wiring patterns 2005 of the main board 2001 of the electronic system 2000 through conductive connections 2800 as in FIG. 35.

Referring to FIG. 36, in an electronic system according to some example embodiments, each of the semiconductor chips 2200 may include a peripheral circuit region 3100, a cell array region 3200 stacked on the peripheral circuit region 3100, and connection wiring 3265. Each of the semiconductor chips 2200 may include the semiconductor memory device described above using FIGS. 1 to 33. As an example, the peripheral circuit region 3100 may include the information storage layer 120, the channel layer 130, and the insulation pattern 140 described above using FIGS. 1 to 33.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

In concluding the detailed description, those skilled in the art will appreciate that many variations and modifications may be made to the example embodiments without substantially departing from the present inventive concepts. Therefore, the disclosed example embodiments of the inventive concepts are used in a generic and descriptive sense only and not for purposes of limitation.

What is claimed is:

1. A semiconductor memory device comprising:
   a first substrate defining a cell array region, and an extended region surrounding the cell array region;
   a mold structure including a plurality of gate electrodes sequentially spaced and stacked on the first substrate, the plurality of gate electrodes stacked on the extended region in a step form;
   a channel hole defined as penetrating the plurality of gate electrodes on the cell array region in a vertical direction perpendicular to an upper surface of the first substrate;
   an information storage layer along side walls and a bottom surface of the channel hole and in contact with the plurality of gate electrodes, the information storage layer including a blocking insulation layer along the side walls and the bottom surface of the channel hole, a charge storage layer on the blocking insulation layer, and a tunneling insulation layer, the charge storage layer including a first plurality of spherical hafnium oxide crystals along side walls of the blocking insulation layer and a second plurality of spherical hafnium oxide crystals along side walls of the tunneling insulation layer and spaced apart from the first plurality of spherical hafnium oxide crystals, the charge storage layer including a first layer surrounding the first plurality of spherical hafnium oxide crystals, the first layer including silicon oxide, the tunneling insulation layer on the first layer, and the charge storage layer including a first barrier layer between the first layer and the tunneling insulation layer, the first barrier layer having a greater band gap than the first layer;
   a second barrier layer between the first plurality of spherical hafnium oxide crystals and the second plurality of spherical hafnium oxide crystals, the second barrier layer including a material different from the first layer and having a smaller band gap than the first layer, the second barrier layer having a greater band gap than the first plurality of spherical hafnium oxide crystals and the second plurality of spherical hafnium oxide crystals;
   a channel layer on the information storage layer inside the channel hole; and
   an insulation pattern arranged to fill the channel hole on the channel layer.

2. The semiconductor memory device of claim 1, further comprising:
   a second substrate below the first substrate;
   a peripheral circuit element on an upper surface of the second substrate;
   an interlayer insulating layer covering the peripheral circuit element between the upper surface of the second substrate and a lower surface of the first substrate; and
   a wiring pattern inside the interlayer insulating layer.

3. The semiconductor memory device of claim 1, further comprising:
   a bit line on the plurality of gate electrodes;
   a second substrate on the bit line;
   a peripheral circuit element on a lower surface of the second substrate;
   an interlayer insulating layer covering the peripheral circuit element between the bit line and the lower surface of the second substrate; and
   a wiring pattern inside the interlayer insulating layer.

4. The semiconductor memory device of claim 1, wherein a diameter of each of the first plurality of spherical hafnium oxide crystals is in a range of 2 nm to 4 nm.

5. The semiconductor memory device of claim 1, wherein a thickness of the first layer is in a range of 4 nm to 8 nm.

6. A semiconductor memory device comprising:
   a substrate;
   a plurality of gate electrodes sequentially spaced and stacked on the substrate;
   a block separation pattern extending in a first horizontal direction on the substrate, and separating the plurality of gate electrodes in a second horizontal direction different from the first horizontal direction;
   a channel hole defined as penetrating the plurality of gate electrodes on the substrate in a vertical direction perpendicular to each of the first and second horizontal directions;
   a blocking insulation layer along side walls and a bottom surface of the channel hole and in contact with the plurality of gate electrodes;
   a charge storage layer on the blocking insulation layer inside the channel hole, the charge storage layer including a first plurality of crystals including hafnium oxide crystals defining a spherical shape along side walls of the blocking insulation layer, the charge storage layer including a first layer surrounding the first plurality of crystals, the first layer including silicon oxide, and the charge storage layer including a first barrier layer on the first layer; and
   a tunneling insulation layer on the charge storage layer inside the channel hole, the first barrier layer between the first layer and the tunneling insulation layer, and the first barrier layer having a greater band gap than the first layer, wherein the charge storage layer includes a second plurality of spherical hafnium oxide crystals along side walls of the tunneling insulation layer and spaced apart from the first plurality of crystals; and
   a second barrier layer between the first plurality of crystals and the second plurality of spherical hafnium oxide crystals, the second barrier layer including a material different from the first layer and having a smaller band gap than the first layer, the second barrier layer having a greater band gap than the first plurality of crystals and the second plurality of spherical hafnium oxide crystals.

7. The semiconductor memory device of claim 6, further comprising:
a channel layer on the tunneling insulation layer inside the channel hole; and
an insulation pattern arranged to fill the channel hole on the channel layer.

8. The semiconductor memory device of claim 6, wherein the first barrier layer includes at least one of aluminum oxide and magnesium oxide.

9. A semiconductor memory device comprising:
a first substrate including a cell array region, and an extended region surrounding the cell array region;
a mold structure including a plurality of gate electrodes sequentially spaced and stacked on the first substrate, the plurality of gate electrodes stacked on the extended region in a step form;
a block separation pattern extending in a first horizontal direction on the first substrate and separating the plurality of gate electrodes in a second horizontal direction different from the first horizontal direction;
a channel hole defined to penetrate the plurality of gate electrodes on the cell array region in a vertical direction perpendicular to each of the first and second horizontal directions;
an information storage layer along side walls and a bottom surface of the channel hole and in contact with the plurality of gate electrodes, the information storage layer including a blocking insulation layer along the side walls and the bottom surface of the channel hole, a charge storage layer on the blocking insulation layer, and a tunneling insulation layer, the charge storage layer including a first plurality of crystals including hafnium oxide crystals defining a spherical shape along side walls of the blocking insulation layer and a second plurality of spherical hafnium oxide crystals along side walls of the tunneling insulation layer and spaced apart from the first plurality of crystals, the charge storage layer including a first layer surrounding the first plurality of crystals, the first layer including silicon oxide, the charge storage layer including a first barrier layer on the first layer, the tunneling insulation layer on the first layer, and a diameter of each of the first plurality of crystals in a range from 2 nm to 4 nm, the first barrier layer between the first layer and the tunneling insulation layer, and the first barrier layer having a greater band gap than the first layer;
a second barrier layer between the first plurality of crystals and the second plurality of spherical hafnium oxide crystals, the second barrier layer including a material different from the first layer and having a smaller band gap than the first layer, the second barrier layer having a greater band gap than the first plurality of crystals and the second plurality of spherical hafnium oxide crystals;
a channel layer on the information storage layer inside the channel hole;
an insulation pattern arranged to fill the channel hole on the channel layer;
a bit line extending in the second horizontal direction on the plurality of gate electrodes;
a second substrate below the first substrate;
a peripheral circuit element on an upper surface of the second substrate;
an interlayer insulating layer covering the peripheral circuit element between the upper surface of the second substrate and a lower surface of the first substrate; and
a wiring pattern inside the interlayer insulating layer.

* * * * *